United States Patent
Kannan et al.

(10) Patent No.: US 8,075,698 B2
(45) Date of Patent: Dec. 13, 2011

(54) SUBSTRATE PROCESSING UNIT, METHOD OF DETECTING END POINT OF CLEANING OF SUBSTRATE PROCESSING UNIT, AND METHOD OF DETECTING END POINT OF SUBSTRATE PROCESSING

(75) Inventors: Hiroshi Kannan, Tokyo (JP); Tadahiro Ishizaka, Yamanashi (JP); Yasuhiko Kojima, Yamanashi (JP); Yasuhiro Oshima, Yamanashi (JP); Takashi Shigeoka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1862 days.

(21) Appl. No.: 10/525,797

(22) PCT Filed: Aug. 28, 2003

(86) PCT No.: PCT/JP03/10939
§ 371 (c)(1),
(2), (4) Date: Feb. 25, 2005

(87) PCT Pub. No.: WO2004/020695
PCT Pub. Date: Mar. 11, 2004

(65) Prior Publication Data
US 2005/0241761 A1    Nov. 3, 2005

(30) Foreign Application Priority Data
Aug. 30, 2002   (JP) .................. 2002-252270

(51) Int. Cl.
*B08B 7/04* (2006.01)

(52) U.S. Cl. .......................... 134/18; 216/59
(58) Field of Classification Search ................ None
See application file for complete search history.

(56) References Cited

U.S. PATENT DOCUMENTS

| | | | | | |
|---|---|---|---|---|---|
| 4,290,781 | A | * | 9/1981 | Wang | 95/35 |
| 4,887,468 | A | * | 12/1989 | McKendree et al. | 73/660 |
| 5,152,172 | A | * | 10/1992 | Leon et al. | 73/579 |
| 5,655,357 | A | * | 8/1997 | Kristen | 53/512 |
| 5,837,094 | A | * | 11/1998 | Tsukazaki et al. | 156/345.25 |
| 6,012,334 | A | * | 1/2000 | Ando et al. | 73/651 |
| 6,238,488 | B1 | | 5/2001 | Fujita et al. | |
| 6,579,371 | B1 | * | 6/2003 | Gimmi et al. | 118/677 |

FOREIGN PATENT DOCUMENTS

| | | | |
|---|---|---|---|
| JP | 62210270 A | * | 9/1987 |
| JP | 63-005532 | | 1/1988 |
| JP | 01293378 A | * | 11/1989 |
| JP | 2-82000 | | 3/1990 |
| JP | 06-224163 | | 8/1994 |
| JP | 08236410 A | * | 9/1996 |
| JP | 09-078267 | | 3/1997 |

(Continued)

*Primary Examiner* — Michael Kornakov
*Assistant Examiner* — Eric Golightly
(74) *Attorney, Agent, or Firm* — Oblon, Spivak, McClelland, Maier & Neustadt, L.L.P.

(57) ABSTRACT

A substrate processing unit comprises a processing vessel for receiving a substrate, a cleaning gas supply system for supplying cleaning gas to the processing vessel so as to clean the interior of the processing vessel, an exhauster for exhausting the processing vessel, an operating state detector for detecting the operating state of the exhauster, and an end point detector for detecting the end point of the cleaning on the basis of the detection result from the operating state detector.

19 Claims, 21 Drawing Sheets

FOREIGN PATENT DOCUMENTS

| | | |
|---|---|---|
| JP | 09-171992 | 6/1997 |
| JP | 9-260358 | 10/1997 |
| JP | 11121430 A * | 4/1999 |
| JP | 11-131211 | 5/1999 |
| JP | 2000-003905 | 1/2000 |
| JP | 2001-164368 | 6/2001 |

* cited by examiner

SUBSTRATE PROCESSING UNIT, METHOD OF DETECTING END POINT OF CLEANING OF SUBSTRATE PROCESSING UNIT, AND METHOD OF DETECTING END POINT OF SUBSTRATE PROCESSING

FIELD OF THE INVENTION

The present invention relates to a substrate processing unit, a method of detecting an end point of a cleaning of a substrate processing unit, and a method of detecting an end point of a substrate processing.

BACKGROUND OF THE INVENTION

There has been known a film forming apparatus for chemically forming a thin film on a semiconductor wafer (hereinafter, referred to as 'wafer' for simplicity). In such a film forming apparatus, the thin film is formed on the wafer by using a plasma or the like.

However, after forming the thin film on the wafer, there are found reaction by-products adhering on an inner wall of a chamber or the like. In case of forming the thin film on the wafer in the presence of the reaction by-products accumulated on the inner wall of the chamber or the like, the reaction by-products may then peel off therefrom to contaminate the wafer. Accordingly, there is a need to remove the reaction by-products adhered to the inner wall of the chamber or the like by regularly cleaning an interior of the chamber.

In cleaning the interior of the chamber, it is important to detect a proper end point of the cleaning in order to avoid an insufficient cleaning, a damage to the inner wall of the chamber or the like due to an excessive cleaning, and a waste of a cleaning gas. Currently, as for a method of detecting the end point of the cleaning, there is known a method of measuring a luminous intensity of a plasma by a spectrometer and then detecting the end point based on the luminous intensity.

Such a method, however, is problematic in that it requires a plasma to be generated to detect the end point of the cleaning, and consequently, is unusable if the cleaning is carried out without generating a plasma.

SUMMARY OF THE INVENTION

It is, therefore, an object of the present invention to provide a substrate processing unit and a method of detecting an end point of a substrate processing, which are capable of detecting an end point of a cleaning without the generation of a plasma. Further, it is another object of the present invention to provide a substrate processing unit and a method of detecting an end point of a substrate processing, which are capable of detecting an end point of a substrate processing without the generation of a plasma.

In accordance with one aspect of the invention, there is provided a substrate processing unit including: a processing vessel for accommodating a substrate; a cleaning gas supply system for supplying a cleaning gas into the processing vessel to be used in performing a cleaning of an interior of the processing vessel; an exhauster for exhausting the interior of the processing vessel; an operating state detector for detecting an operating state of the exhauster; and an end point detector for detecting an end point of the cleaning based on a detection result from the operating state detector. Since the substrate processing unit of the present invention includes the operating state detector and the end point detector, the end point of the cleaning can be detected without the generation of a plasma.

In accordance with another aspect of the invention, there is provided a substrate processing unit including: a processing vessel for accommodating a substrate; a process gas supply system for supplying a process gas into the processing vessel to be used in performing a processing on the substrate; an exhauster for exhausting an interior of the processing vessel; an operating state detector for detecting an operating state of the exhauster; and an end point detector for detecting an end point of the processing based on a detection result from the operating state detector. Since the substrate processing unit of the present invention includes the operating state detector and the end point detector, the end point of the substrate processing can be detected without the generation of a plasma.

The operating state detector may include a vibration detector for detecting a vibration of the exhauster. The vibration of the exhauster, which is detected by the vibration detector, may be the vibration itself or a sound wave. By including the vibration detector, it is possible to detect the end point of the cleaning or the substrate processing based on the vibration caused by the exhauster.

The vibration detector may include a sound wave detector for detecting the sound wave produced by the vibration of the exhauster. By including the sound wave detector, it is possible to detect the end point of the cleaning or the substrate processing based on the sound wave produced by the vibration of the exhauster.

The end point detector may detect the end point based on a change in the intensity of a vibration. The change in the intensity of the vibration includes a change in the intensity of the vibration at a predetermined frequency or a peak frequency. By detecting the end point based on the change in the intensity of the vibration, the end point of the cleaning or the substrate processing can be detected reliably.

The exhauster may include a rotatable body of revolution for exhaust, and the operating state detector may include a rotation detector for detecting a rotation of the body of revolution. The rotation of the body of revolution may be detected by the rotation detector in terms of the rotational frequency or rotational velocity of the body of revolution. By including the rotation detector, it is possible to detect the end point of the cleaning or that of the substrate processing based on the rotation of the body of revolution.

The exhauster may include a rotatable body of revolution for exhaust and a driving mechanism for rotating the body of revolution by a current supply, and the operating state detector may include a current detector for detecting a current supplied to the driving mechanism. By including the current detector, it is possible to detect the end point of the cleaning or that of the substrate processing based on the current supplied to the driving mechanism.

The exhauster may include a rotatable body of revolution for exhaust and a magnetic bearing for supporting the body of revolution by a current supply, and the operating state detector may include a current detector for detecting a current supplied to the magnetic bearing. By including the current detector, it is possible to detect the end point of the cleaning or that of the substrate processing based on the current supplied to the magnetic bearing.

In accordance with still another aspect of the invention, there is provided a method of detecting an end point of a cleaning of a substrate processing unit, the method including the steps of: an operating state detecting process for detecting an operating state of an exhauster wherein a cleaning gas is supplied into a processing vessel of the substrate processing unit to be used in cleaning an interior of the processing vessel and the interior of the processing vessel is exhausted by the exhauster; and an end point detecting process for detecting the end point of the cleaning based on the detected operating state of the exhauster. Since the method of detecting the end point of the cleaning of the substrate processing unit of the present invention includes the operating state detecting process and the end point detecting process, the end point of the cleaning can be detected without the generation of a plasma.

In accordance with a still further aspect of the invention, there is provided a method of detecting an end point of a substrate processing, the method including the steps of: an operating state detecting process for detecting an operating state of an exhauster wherein a process gas is supplied into a processing vessel which accommodates therein a substrate to be processed and an interior of the processing vessel is exhausted by the exhauster; and an end point detecting process for detecting the end point of the processing based on the detected operating state of the exhauster. Since the method of detecting the end point of the substrate processing of the present invention includes the operating state detecting process and the end point detecting process, the end point of the substrate processing can be detected without the generation of a plasma.

DETAILED DESCRIPTION OF THE PREFERRED EMBODIMENTS

First Preferred Embodiment

Figure 1:
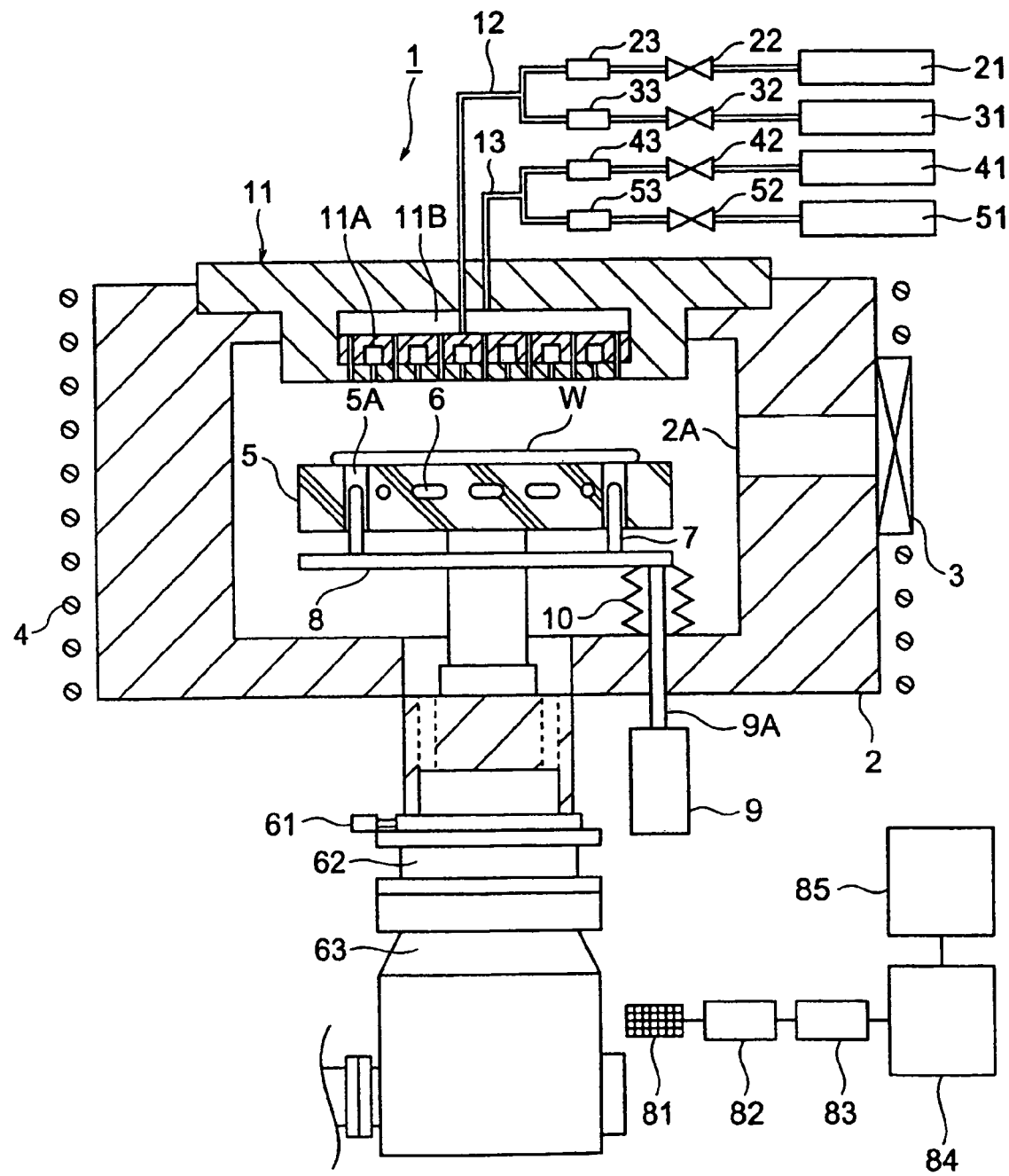
FIG. 1 shows a schematic diagram of a film forming apparatus in accordance with a first preferred embodiment.
Figure 2:
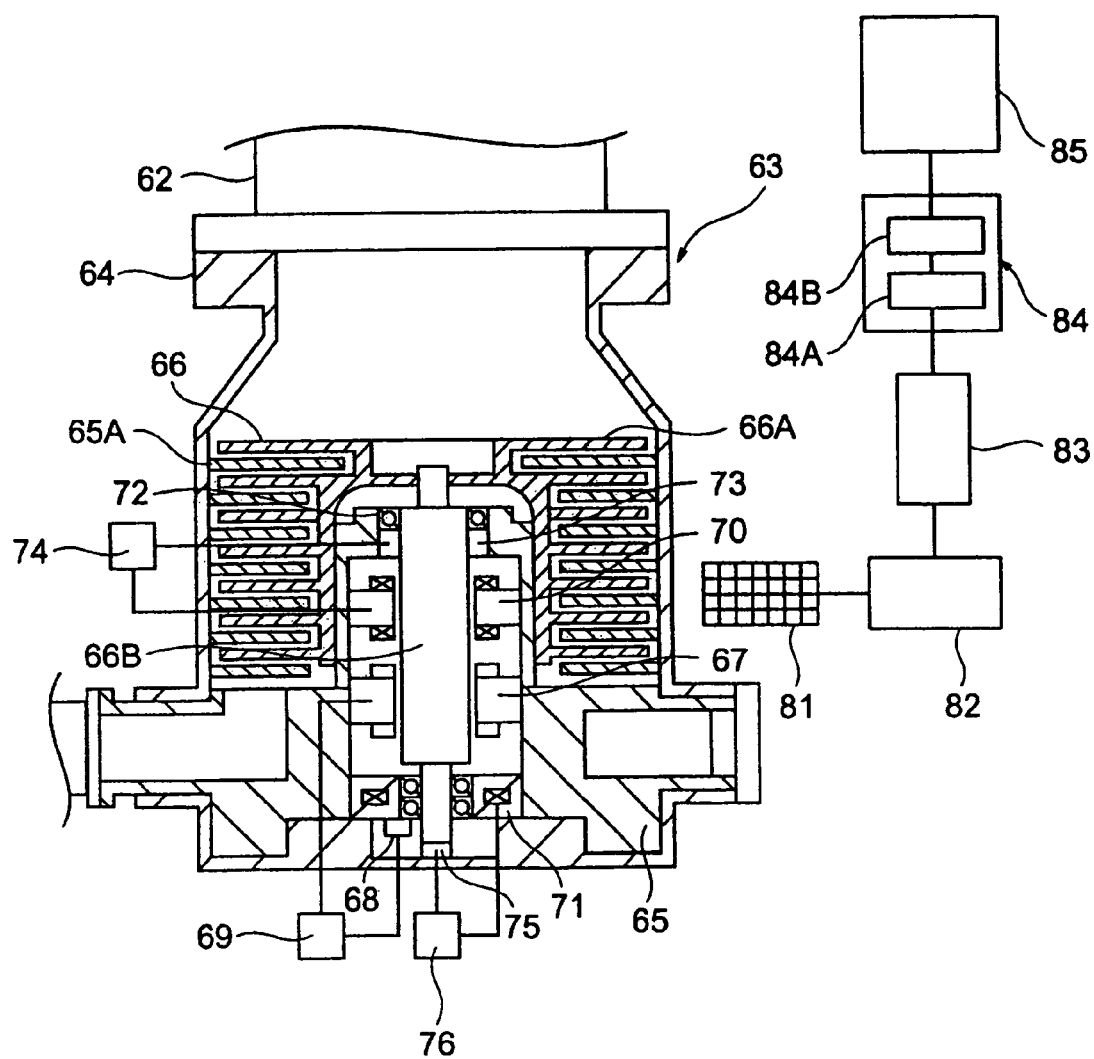
FIG. 2 illustrates a schematic diagram of a turbo molecular pump in accordance with the first preferred embodiment and peripheral portions thereof.

Hereinafter, a first preferred embodiment of the present invention will be described. FIG. 1 shows a schematic diagram of a film forming apparatus in accordance with this preferred embodiment, and FIG. 2 illustrates a schematic diagram of a turbo molecular pump in accordance with this preferred embodiment and peripheral portions thereof.

As illustrated in FIG. 1, a film forming apparatus 1 has a chamber 2 made of, e.g., aluminum or stainless steel. Further, a surface treatment such as an alumite treatment or the like may be performed on the chamber 2.

An opening 2A is formed at a side portion of the chamber 2, and a gate valve 3, which is opened and closed for loading and unloading a wafer W into and from the chamber 2, is attached near the opening 2A. A heater 4 for heating the chamber 2 to a predetermined temperature winds around an exterior of the chamber 2.

Provided in the chamber 2 is a susceptor 5 for mounting thereon the wafer W. The susceptor 5 is made of ceramic such as, e.g., AlN, $Al_2O_3$ or the like. Provided in the susceptor 5 is a heater 6 for heating the susceptor 5 to a predetermined temperature. By heating the susceptor 5 with the heater 6 to the predetermined temperature, the wafer W mounted on the susceptor 5 is heated to a predetermined temperature.

Holes 5A for raising and lowering the wafer W are formed at three portions of the susceptor 5 in a vertical direction. Provided under the holes 5A are wafer elevating pins 7 that are insertable into the respective holes 5A. The wafer elevating pins 7 are fixedly installed standing on a wafer supporting pin support 8.

An air cylinder 9 is fixed to the wafer elevating pin support 8. As a rod 9A of the air cylinder 9 is contracted by an operation of the air cylinder 9, the wafer supporting pins 7 are lowered, thereby making the wafer W be mounted on the susceptor 5. And, as the rod 9A is extended by an operation of the air cylinder 9, the wafer elevating pins 7 are raised, thereby resulting in the wafer W being separated from the susceptor 5. Provided in the chamber 2 is an expansible/contractible bellows 10 covering the rod 9A. By covering the rod 9A with the bellows 10, an interior of the chamber 2 is airtightly maintained.

An opening is formed at an upper portion of the chamber 2. Inserted into the opening is a shower head 11 for supplying a gas such as $TiCl_4$ or the like into the chamber 2. The shower head 11 has a structure divided into a gas supply unit 11A for supplying $TiCl_4$ and Ar and a gas supply unit 11B for supplying $NH_3$ and $ClF_3$. Formed at the gas supply units 11A and 11B are a plurality of gas supply openings for discharging gases such as $TiCl_4$ or the like.

Connected to the gas supply unit 11A is a gas supply line 12 for supplying $TiCl_4$ and Ar to the gas supply unit 11A, and a leading end of the gas supply line 12 is divided into two parts. Connected to the gas supply unit 11B is a gas supply line 13 for supplying $NH_3$ and $ClF_3$ to the gas supply unit 11B, and a leading end of the gas supply line 13 is divided into two parts.

A $TiCl_4$ supply source 21 accommodating therein $TiCl_4$ is connected to one end portion of the gas supply line 12. Interposed at the gas supply line 12 are an openable and closable valve 22 for supplying $TiCl_4$ and a mass flow controller (MFC) 23 for controlling a flow rate of $TiCl_4$. By opening the valve 22 when the mass flow controller 23 is adjusted, $TiCl_4$ of a predetermined flow rate is supplied from the $TiCl_4$ supply source 21 into the chamber 2.

An Ar supply source 31 accommodating therein Ar is connected to the other end portion of the gas supply line 12. Interposed at the gas supply line 12 are an openable and closable valve 32 for supplying Ar and a mass flow controller (MFC) 33 for controlling a flow rate of Ar. By opening the valve 32 when the mass flow controller 33 is adjusted, Ar is supplied at a predetermined flow rate from the Ar supply source 31 into the chamber 2.

An $NH_3$ supply source 41 accommodating therein $NH_3$ is connected to one end portion of the gas supply line 13. Interposed at the gas supply line 13 are an openable and closable valve 42 for supplying $NH_3$ and a mass flow controller (MFC) 43 for controlling a flow rate of $NH_3$. By opening the valve 42 when the mass flow controller 43 is adjusted, $NH_3$ is supplied at a predetermined flow rate from the $NH_3$ supply source 41 into the chamber 2.

Connected to the other end portion of the gas supply line 13 is a $ClF_3$ supply source 51 accommodating therein $ClF_3$ for removing TiN adhered to an inner wall of the chamber 2 or the like. Interposed at the gas supply line 13 are a valve 52 and a mass flow controller 53 for controlling a flow rate of $ClF_3$. By opening the valve 52 when the mass flow controller 53 is adjusted, $ClF_3$ is supplied at a predetermined flow rate from the $ClF_3$ supply source 51 into the chamber 2.

Connected to a bottom portion of the chamber 2 is a turbo molecular pump 63 for exhausting the interior of the chamber 2 via an auto pressure controller (APC) 61 for controlling an inner pressure of the chamber 2 and a gas exhaust line 62. By operating the turbo molecular pump 63 in a state that a conductance is adjusted by the auto pressure controller 61, the interior of the chamber 2 is maintained under a predetermined pressure.

As shown in FIG. 2, the turbo molecular pump 63 has a case 64. Provided in the case 64 are a stator 65 and a rotor 66 that rotates relative to the stator 65. The stator 65 has stator blades 65A, and the rotor 66 has rotor blades 66A and a rotation axis 66B. A motor 67 is provided between the stator 65 and the rotation axis 66B. By operating the motor 67, the rotor 66 rotates relative to the stator 65.

Provided near the rotation axis 66B is a rotational frequency sensor 68 for measuring a rotational frequency of the rotor 66. Electrically connected to the rotational frequency sensor 68 is a motor controller 69 for correcting a deviation of the rotational frequency of the rotor 66 by controlling the motor 67, and thereby rotating the rotor 66 at a predetermined rotational frequency. The motor controller 69 corrects the deviation of the rotational frequency of the rotor 66 by controlling a current supplied to the motor 67 based on a measurement result of the rotational frequency sensor 68, and thereby rotates the rotor 66 at the predetermined rotational frequency.

A radial magnetic bearing 70 and a thrust magnetic bearing 71 are provided between the stator 65 and the rotation axis 66B. With currents supplied to the radial magnetic bearing 70 and the thrust magnetic bearing 71, the rotor 66 is raised and then supported by the radial magnetic bearing 70 and the thrust magnetic bearing 71 without being in contact therewith. Further, a protection bearing 72 is provided between the stator 65 and the rotation axis 66B. The protection bearing 72 supports the rotor 66 while currents are not supplied to the radial magnetic bearing 70 and the thrust magnetic bearing 71.

Provided near the rotation axis 66B is a radial position sensor 73 for detecting a position of the rotor 66 in a radial direction. Electrically connected to the radial position sensor 73 is a radial magnetic bearing controller 74 to correct a misalignment of the rotor 66 in the radial direction by controlling the radial magnetic bearing 70, and thereby to position the rotor 66 at a predetermined location. The radial magnetic bearing controller 74 controls an attractive force of the radial magnetic bearing 70 by controlling the current supplied to the radial magnetic bearing 70 based on a detection result of the radial position sensor 73, thereby correcting the misalignment of the rotor 66 in the radial direction to position the rotor 66 at the predetermined location.

Provided near the rotation axis 66B is a thrust position sensor 75 for detecting a position of the rotor 66 in a thrust direction. Electrically connected to the thrust position sensor 75 is a thrust magnetic bearing controller 76 to correct a misalignment of the rotor 66 in the thrust direction by controlling the thrust magnetic bearing 71 to position the rotor 66 at a predetermined location. Same as in the radial magnetic bearing controller 74, the thrust magnetic bearing controller 76 controls an attractive force of the thrust magnetic bearing 71 by controlling the current supplied to the thrust magnetic bearing 71 based on a detection result of the thrust position sensor 75, thereby correcting the misalignment of the rotor 66 in the thrust direction to thereby position the rotor 66 at the predetermined location.

Provided near the case 64 is a microphone 81 for measuring an intensity of a sound wave generated from the case 64. Electrically connected to the microphone 81 is an end point detector 84 for detecting an end point of a cleaning via an amplifier 82 for amplifying an output signal of the microphone 81 and a bandpass filter 83 for passing a signal in a specified frequency range from the signals amplified by the amplifier 82. Electrically connected to the end point detector 84 is a system controller 85 for controlling the valve 52 and the like.

The end point detector 84 includes an A/D conversion interface 84A, a CPU 84B and the like. The A/D conversion interface 84A converts an analog signal outputted from the bandpass filter 83 into a digital signal. The CPU 84B detects the end point of the cleaning based on the output signal of the A/D conversion interface 84A.

To be specific, the CPU 84B reads intensity information on a sound wave based on the A/D conversion interface 84A to thereby determine whether or not an intensity of the sound wave has declined. If it is determined that the intensity of the sound wave has not declined, intensity information on a next sound wave is read and then it is determined again whether or not the intensity thereof has declined. On the other hand, if it is determined that the intensity of the sound wave has declined, it is determined whether or not the intensity thereof is stable. If the intensity thereof is determined to be unstable, intensity information on a next sound wave is read and then it is determined again whether or not the intensity thereof is stable. On the other hand, in case the intensity of the sound wave is determined to be stable, a signal informing that the end point of the cleaning is detected is outputted to the system controller 85. Based on such a signal, the system controller 85 controls the valve 52 to be closed or the like.

Figure 3:
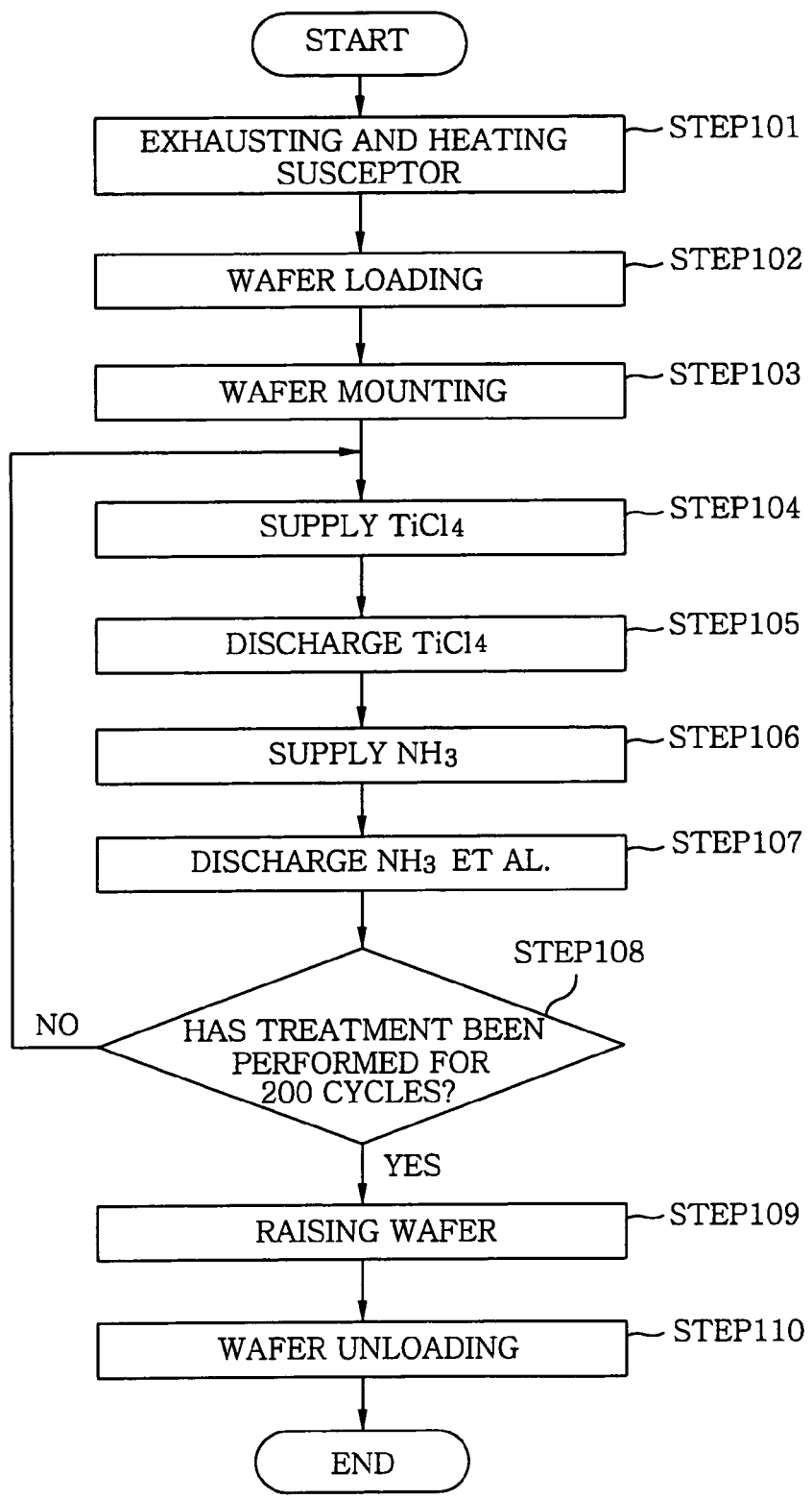
FIG. 3 provides a flowchart depicting a film forming process performed in the film forming apparatus in accordance with the first preferred embodiment.

Hereinafter, a film forming process performed in the film forming apparatus 1 will be described with reference to FIG. 3. FIG. 3 provides a flowchart depicting the film forming process performed in the film forming apparatus 1 in accordance with this preferred embodiment.

First of all, a rough pumping process is performed by operating a rough pumping pump (not shown). When the interior of the chamber 2 is depressurized to a certain extent, a main pumping process of the interior of the chamber 2 is performed by operating the turbo molecular pump 63. And, a current flows in the heater 6 to heat the susceptor 5 (step 101).

After the inner pressure of the chamber 2 decreases to a predetermined pressure level and the susceptor 5 is heated to a predetermined temperature, the gate valve 3 is opened and a wafer W is loaded into the chamber 2 by extending a transfer arm (not illustrated) supporting the wafer W (step 102).

Next, the transfer arm is gradually contracted, and thus, the wafer W is mounted on the wafer elevating pins 7. After the wafer W is mounted on the wafer elevating pins 7, the wafer elevating pins 7 are lowered by an operation of the air cylinder 9, thereby mounting the wafer W on the susceptor 5 (step 103).

After the wafer W is stabilized at a temperature of about 400° C., the valve 22 is opened to supply $TiCl_4$ at a flow rate of about 30 sccm into the chamber 2 (step 104) while maintaining the inner pressure of the chamber 2 at a level ranging from about 50 to 400 Pa. When the supplied $TiCl_4$ is in contact with the wafer W, $TiCl_4$ is adsorbed on a surface of the wafer W.

After a predetermined period of time, the valve 22 is closed to stop the supply of $TiCl_4$, and $TiCl_4$ remaining in the chamber 2 is discharged therefrom (step 105). Further, while discharging, the pressure in the chamber 2 is maintained at about $1.33 \times 10^{-2}$ Pa.

After a predetermined period of time, the valve 42 is opened and $NH_3$ is supplied at a flow rate of about 100 sccm into the chamber 2 (step 106). If the supplied $NH_3$ is in contact with $TiCl_4$ adsorbed on the wafer W, $TiCl_4$ reacts with $NH_3$, thereby forming a TiN film on the wafer W.

After a predetermined period of time, the valve 42 is closed to stop the supply of $NH_3$, and $NH_3$ and the like remaining in the chamber 2 is discharged therefrom (step 107). Further, while discharging, the pressure in the chamber 2 is maintained at about $1.33 \times 10^{-2}$ Pa.

After a predetermined period of time, assuming that the processes of steps 104 to 107 are included in one cycle, the system controller 85 determines whether or not a treatment of about 200 cycles has been performed (step 108). If it is determined that the treatment of about 200 cycles has not been performed, the processes of steps 104 to 107 are performed again.

If it is determined that the treatment of about 200 cycles has been performed, the wafer elevating pins 7 are raised by an operation of the air cylinder 9, thereby resulting in the wafer W being separated from the susceptor 5 (step 109). Further, if the treatment of about 200 cycles has been performed, a TiN film of about 10 nm is formed on the wafer W.

Thereafter, after the gate valve 3 is opened, the transfer arm (not shown) is extended to support the wafer W thereon. Finally, the transfer arm is gradually contracted to unload the wafer W from the chamber 2 (step 110).

Figure 4:
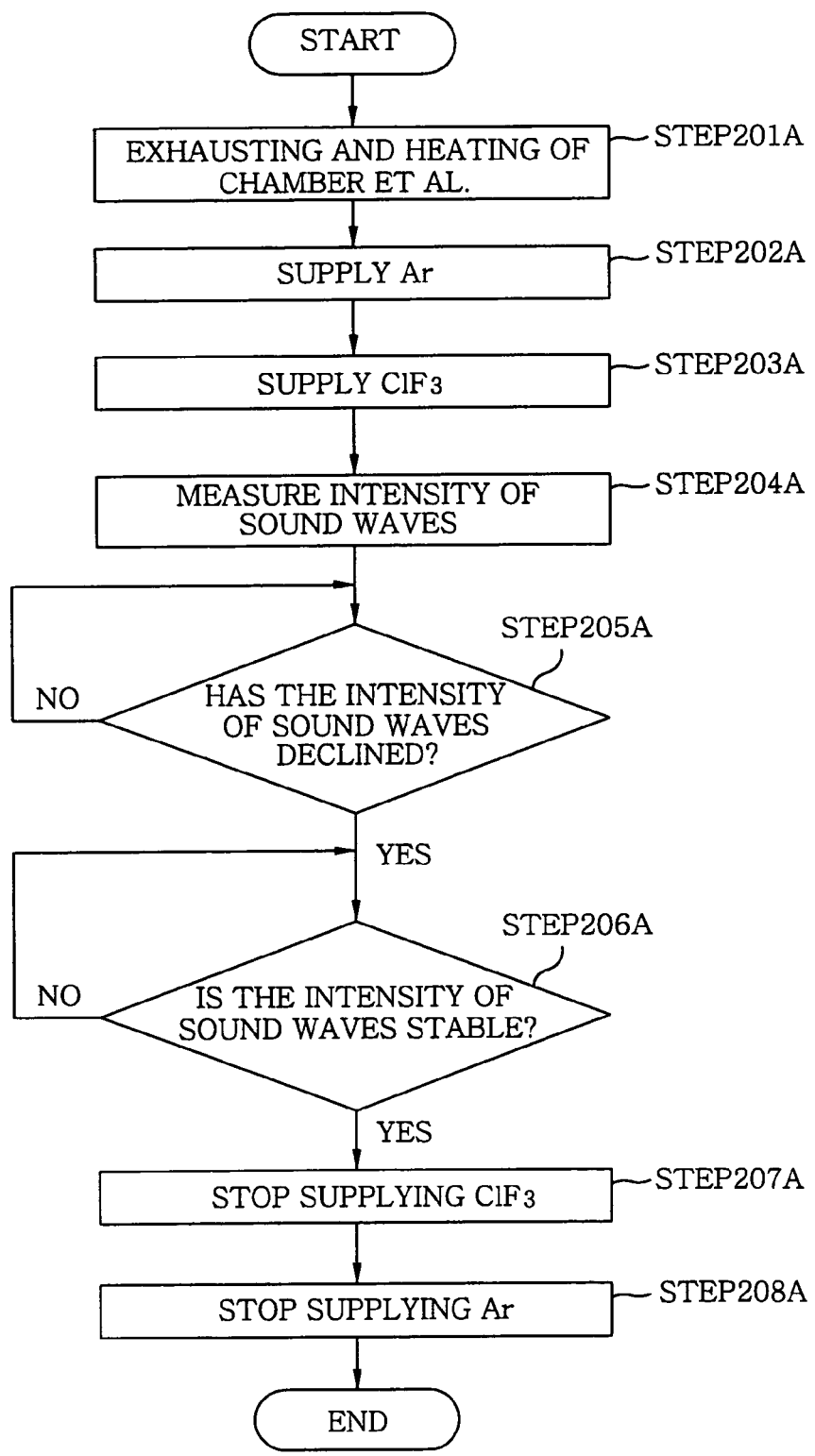
FIG. 4 describes a flowchart showing a cleaning process performed in the film forming apparatus in accordance with the first preferred embodiment.
Figure 5A:
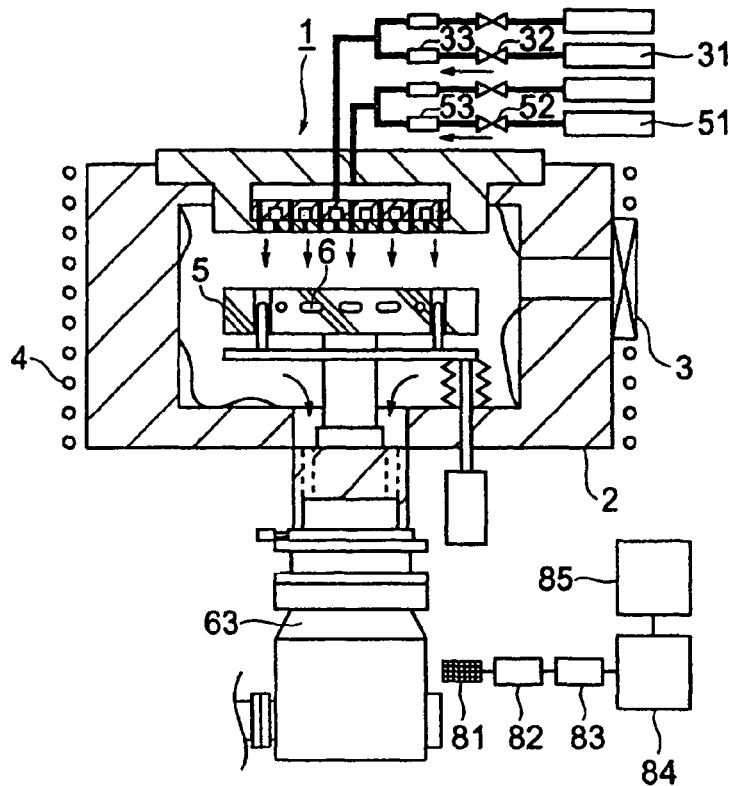
FIGS. 5A and 5B present a schematic cleaning process in accordance with the first preferred embodiment.
Figure 5B:
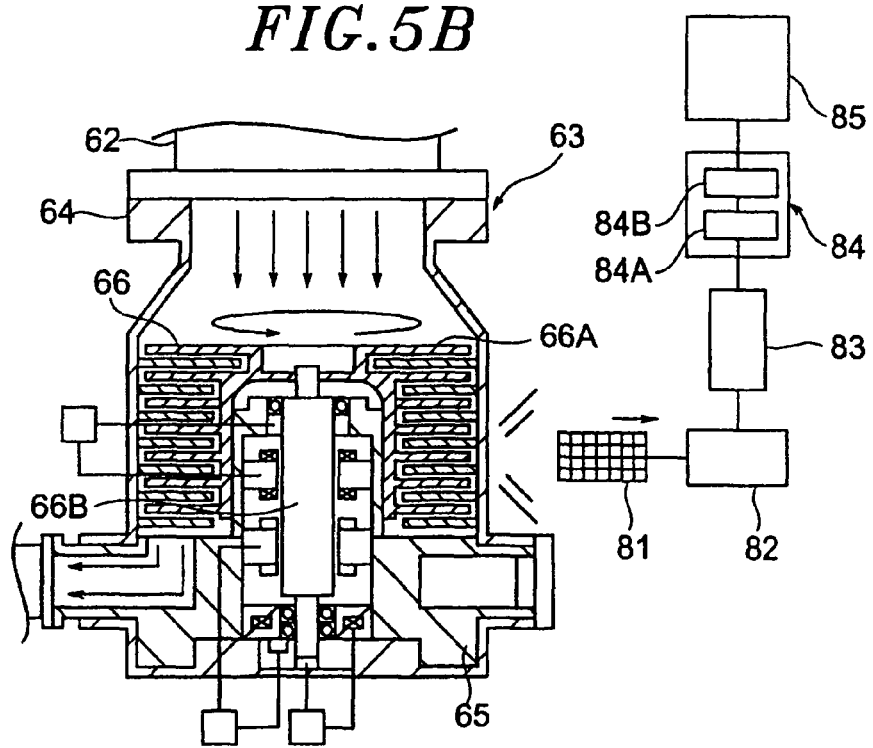
Figure 6:
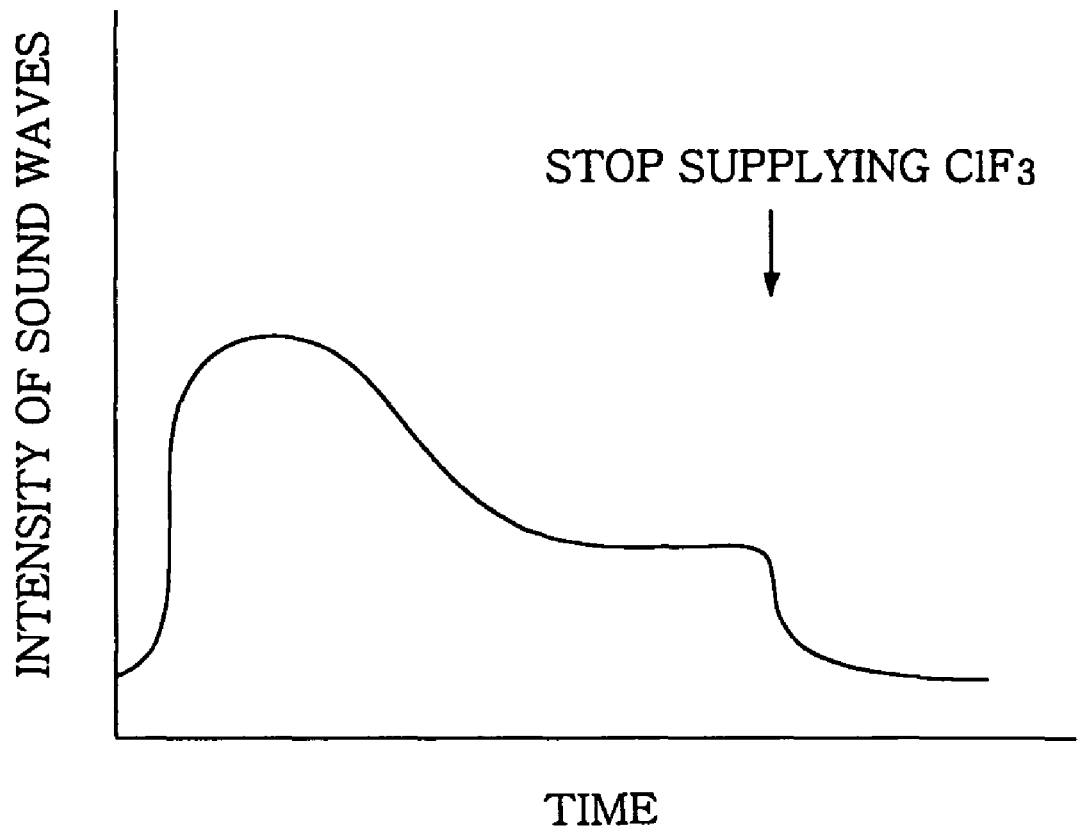
FIG. 6 represents a graph schematically illustrating an intensity of a sound wave produced in a case in accordance with the first preferred embodiment.

Hereinafter, a cleaning process performed in the film forming apparatus 1 will be described with reference to FIGS. 4 to 6. FIG. 4 describes a flowchart showing the cleaning process performed in the film forming apparatus 1 in accordance with this preferred embodiment. FIGS. 5A and 5B present a schematic cleaning process in accordance with this preferred embodiment. FIG. 6 shows a graph schematically illustrating an intensity of a sound wave produced from the case 64 in accordance with this preferred embodiment.

First of all, a rough pumping process is performed by operating a rough pumping pump (not shown). When the interior of the chamber 2 is depressurized to a certain extent, a main pumping process of the interior of the chamber 2 is performed by operating the turbo molecular pump 63. Further, currents flow in the heaters 4 and 6 to heat the chamber 2, the susceptor 5 and the like (step 201A). Moreover, while the turbo molecular pump 63 is operated, a rotational frequency of the rotor 66 is measured by the rotational frequency sensor 68, and a deviation of the rotational frequency of the rotor 66 is corrected by the motor controller 69. Furthermore, the radial position sensor 73 and the thrust position sensor 75 detect a position of the rotor 66 in a radial and a thrust direction, respectively, and the radial magnetic bearing controller 74 and the thrust magnetic bearing controller 76 correct misalignments of the rotor 66 in the radial and the thrust direction, respectively.

After the inner pressure of the chamber 2 is maintained at about 150 Pa and a temperature of the chamber 2 and that of the susceptor 5 are respectively stabilized at about 120° C. and 200° C., the valve 32 is opened to supply Ar at a flow rate of about 100 sccm into the chamber 2 (step 202A). Here, Ar is supplied at a nearly constant flow rate while a cleaning is performed.

Then, the valve 52 is opened to supply $ClF_3$ at a flow rate of about 200 sccm into the chamber 2 as illustrated in FIG. 5A (step 203A). Once $ClF_3$ begins to be supplied into the chamber 2, the cleaning of the chamber 2 is started, and accordingly, TiN adhered to the chamber 2 or the like is removed. Specifically, if $ClF_3$ is supplied into the chamber 2, $ClF_3$ reacts on TiN, resulting in a production of $TiF_4$, $NF_3$, and ClF. Since $TiF_4$, $NF_3$, and ClF thus produced are in a gas state, they are immediately discharged from the chamber 2 by the exhaust. Besides, $ClF_3$ is supplied at a nearly constant flow rate while the cleaning is performed.

Next, in a state where the cleaning is being carried out, an intensity of the sound wave produced from the case 64 is measured by the microphone 81, as shown in FIG. 5B (step 204A). Hereinafter, a generation principle of the sound wave produced from the case 64 will be described. If a gas such as $TiF_4$ or the like, which is discharged from the chamber 2, collides with the rotor blade 66A, the rotor blade 66A vibrates to thereby produce a sound wave. Further, the sound wave makes the case 64 vibrate and the vibration produce a sound wave.

The information on the intensity of the sound wave, which is measured by the microphone 81, is sent to the A/D conversion interface 84A via the amplifier 82 and the bandpass filter 83. The intensity information of the sound wave, which is sent to the A/D conversion interface 84A, is read by the CPU 84B to determine whether or not the intensity of the sound wave has declined (step 205A). In case it is determined that the intensity thereof has not declined, intensity information of a next sound wave is read and it is determined again whether or not the intensity of the sound wave has declined.

If it is determined that the intensity of the sound wave has declined, it is determined whether or not the intensity thereof is stable (step 206A). In case the intensity thereof is determined to be unstable, intensity information of a next sound wave is read and it is determined again whether or not the intensity thereof is stable.

As depicted in FIG. 6, in case the intensity of the sound wave is determined to be stable, a signal is outputted from the CPU 84B to the system controller 85 to close the valve 52 and stop the supply of $ClF_3$ (step 207A). Thereby, the cleaning is completed. As a final step, the valve 32 is closed, and the supply of Ar is stopped (step 208A).

In this preferred embodiment, the intensity of the sound wave produced from the case 64 is measured, and then, the end point of the cleaning is detected based on a change in the intensity of the sound wave. Therefore, the end point of the cleaning can be detected without the generation of a plasma. In detail, the intensity of the sound wave produced from the case 64 changes depending on a type and an amount of a gas discharged from the chamber 2. Specifically, as a molecular weight of the gas colliding with the rotor blade 66A becomes smaller, the intensity of the sound wave declines; and as the amount of the gas colliding with the rotor blade 66A becomes smaller, the intensity of the sound wave declines. Meanwhile, the amount of a produced gas such as $TiF_4$ or the like decreases as the cleaning progresses. Therefore, as the cleaning progresses, the intensity of the sound wave produced from the case 64 declines. Further, by the time the gas is rarely produced to be discharged, the intensity of the sound wave becomes stable. Accordingly, the end point of the cleaning can be detected based on the change in the intensity of the sound wave produced from the case 64. As a result, without the generation of a plasma, it is possible to detect the end point of the cleaning.

Second Preferred Embodiment

Figure 7:
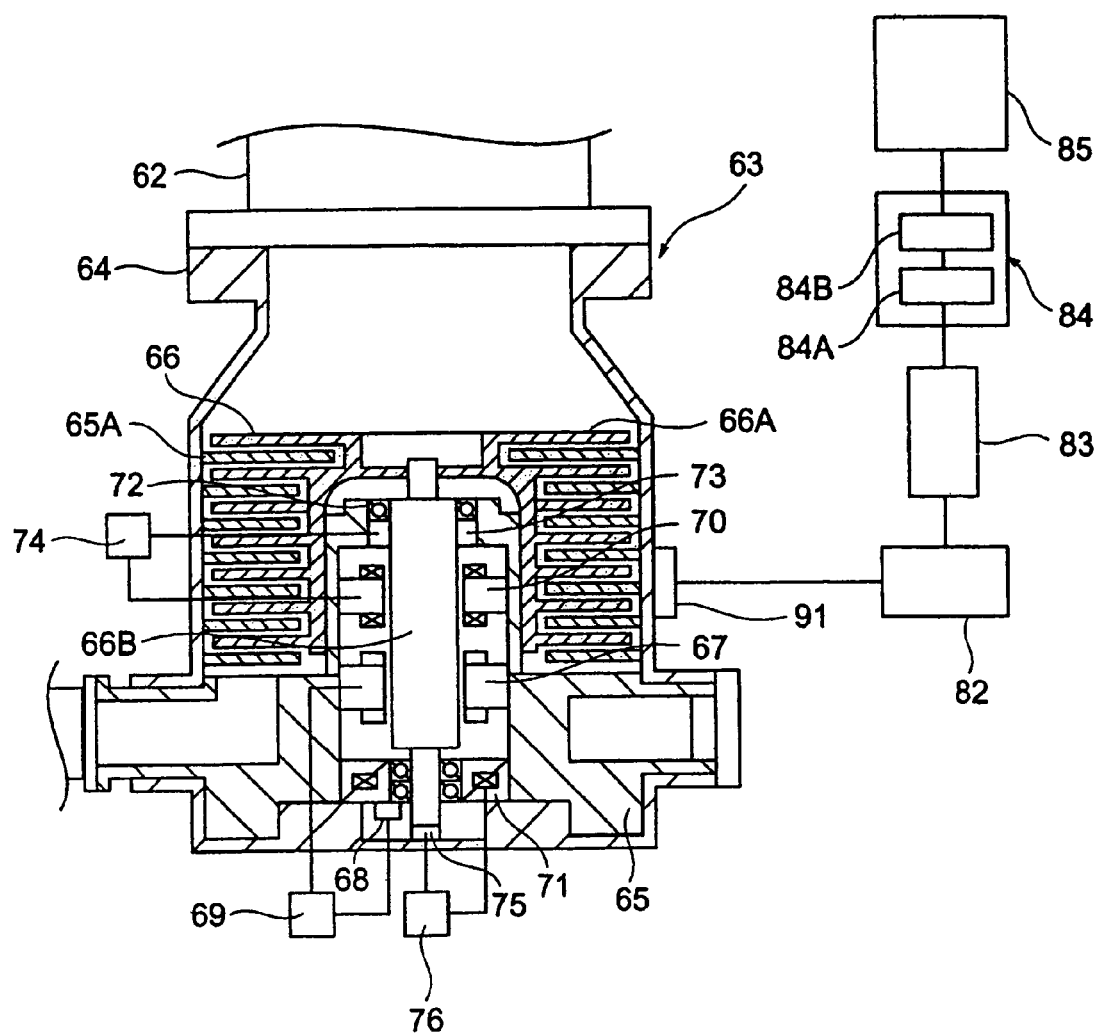
FIG. 7 offers a schematic diagram of the turbo molecular pump in accordance with a second preferred embodiment and the peripheral portions thereof.

Hereinafter, the second preferred embodiment of the present invention will be described. Further, when describing preferred embodiments hereinafter, any redundant repetition may be omitted. In this preferred embodiment, an example in which an end point of a cleaning is detected by measuring an intensity of a vibration of a case will be described. FIG. 7 offers a schematic diagram of a turbo molecular pump in accordance with this preferred embodiment and peripheral portions thereof.

As shown in FIG. 7, fixed on the case 64 is a piezoelectric sensor 91 for measuring intensity of a vibration of the case 64. The piezoelectric sensor 91 is electrically connected to the end point detector 84 via the amplifier 82 and the bandpass filter 83.

Figure 8:
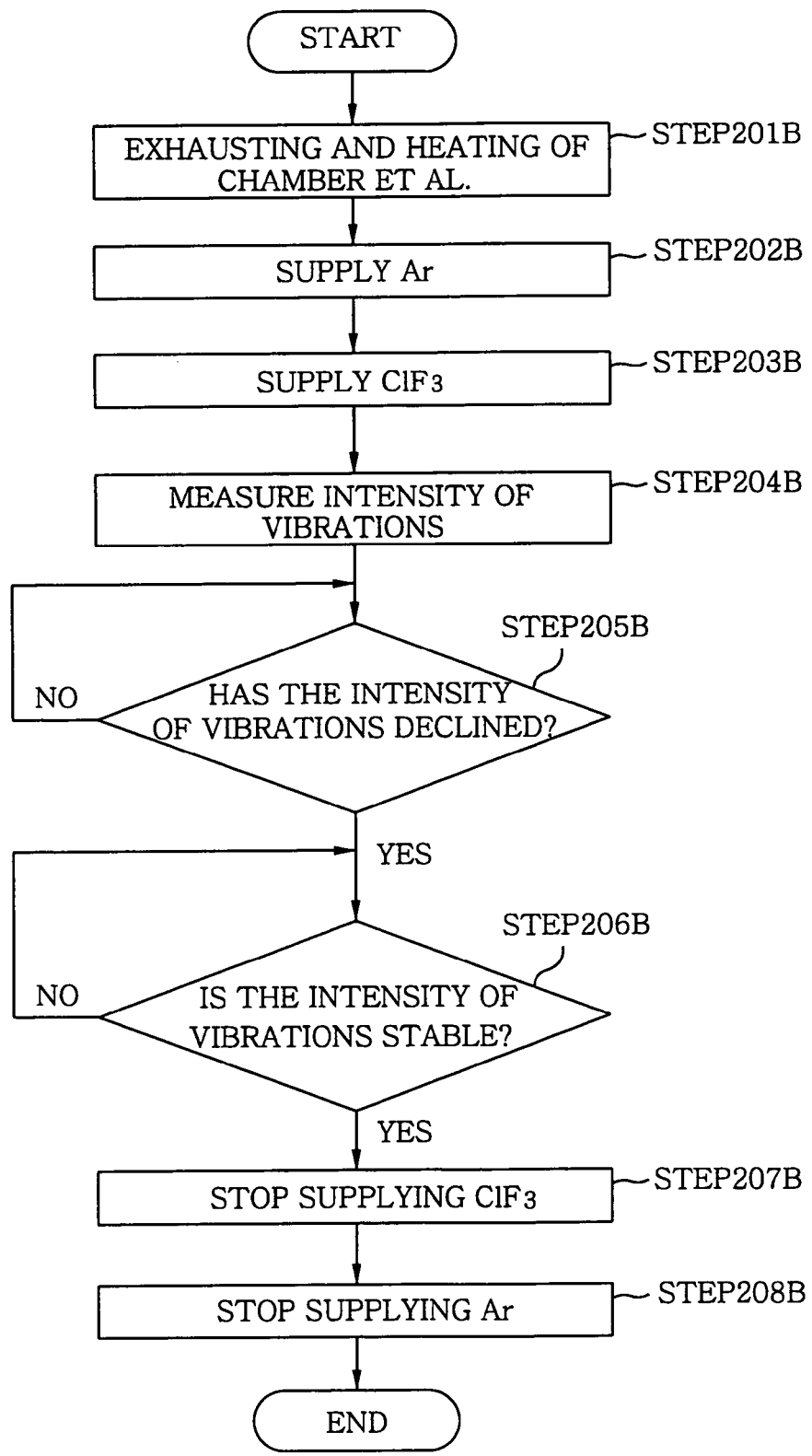
FIG. 8 shows a flowchart describing a cleaning process performed by a film forming apparatus in accordance with the second preferred embodiment.
Figure 9:
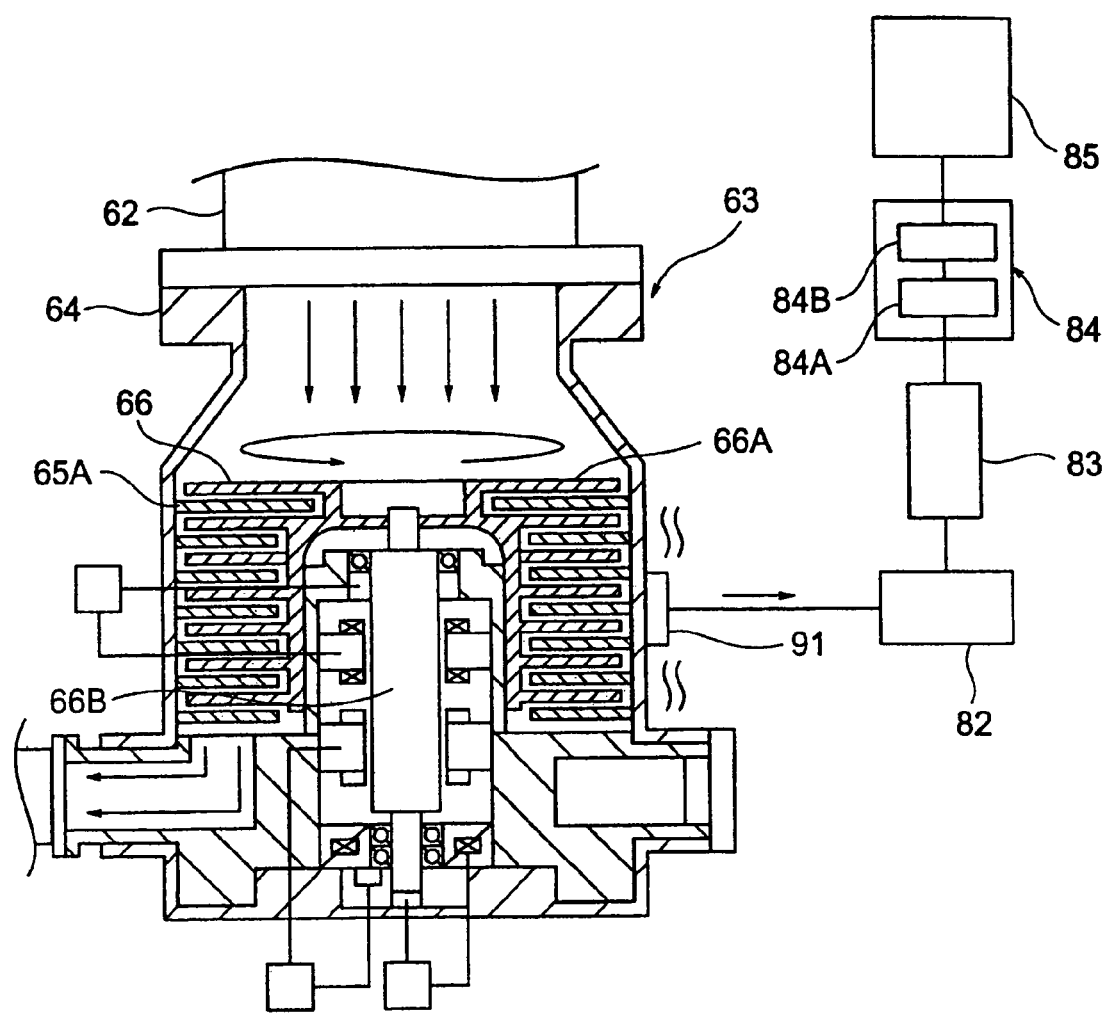
FIG. 9 illustrates a schematic cleaning process in accordance with the second preferred embodiment.

Hereinafter, a cleaning process performed in the film forming apparatus 1 will be described with reference to FIGS. 8 and 9. FIG. 8 shows a flowchart describing the cleaning process performed in the film forming apparatus 1 in accordance with this preferred embodiment, and FIG. 9 illustrates a schematic cleaning process in accordance with this preferred embodiment.

First of all, a rough pumping process is performed on the interior of the chamber 2, and then, a main pumping process is performed thereon. And, the chamber 2, the susceptor 5 and the like are heated (step 201B).

After the inner pressure of the chamber 2 is maintained under 150 Pa and a temperature of the chamber 2 and that of the susceptor 5 are respectively stabilized at about 120° C. and 200° C., Ar is supplied at a flow rate of about 100 sccm into the chamber 2 (step 202B).

Next, $ClF_3$ is supplied at a flow rate of about 200 sccm into the chamber 2 (step 203B).

Thereafter, in a state in which the cleaning is being performed, the intensity of a vibration of the case 64 is measured by the piezoelectric sensor 91, as illustrated in FIG. 9 (step 204B).

The intensity information of the vibration, which is measured by the piezoelectric sensor 91, is sent to the A/D conversion interface 84A via the amplifier 82 and the bandpass filter 83. The intensity information of the vibration, which is sent to the A/D conversion interface 84A, is read by the CPU 84B to thereby determine whether or not the intensity of the vibration has declined (step 205B). In case it is determined that the intensity thereof has not declined, intensity information of a next vibration is read and it is determined again whether or not the intensity of the vibration has declined.

In case it is determined that the intensity thereof has declined, it is determined whether of not the intensity thereof is stable (step 206B). If the intensity thereof is determined to be unstable, intensity information of a next vibration is read and it is determined again whether or not the intensity of the vibration is stable.

If the intensity thereof is determined to be stable, a signal is outputted from the CPU 84B to the system controller 85 and the supply of $ClF_3$ is stopped (step 207B) As a final step, the supply of Ar is stopped (step 208B).

The Third Preferred Embodiment

Figure 10:
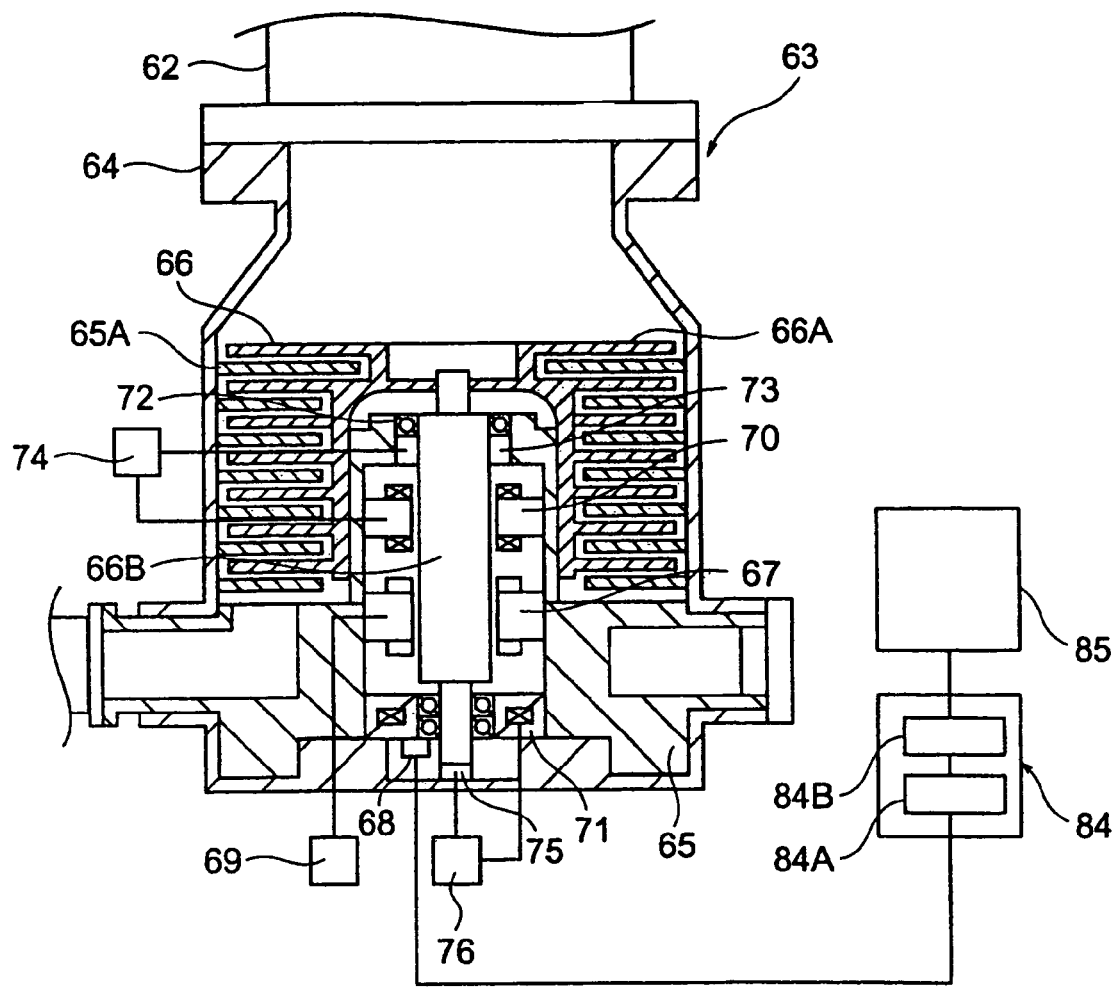
FIG. 10 depicts a schematic diagram of a turbo molecular pump in accordance with a third preferred embodiment and peripheral portions thereof.

Hereinafter, the third preferred embodiment of the present invention will be described. In this preferred embodiment, an example in which an end point of a cleaning is detected by measuring a rotational frequency of a rotor will be described. FIG. 10 depicts a schematic diagram of a turbo molecular pump in accordance with this preferred embodiment and peripheral portions thereof.

As illustrated in FIG. 10, the rotational frequency sensor 68 is electrically connected to the end point detector 84. Further, in this preferred embodiment, the motor controller 69 supplies a nearly constant current to the motor 67 regardless of a measurement result of the rotational frequency sensor 68.

Figure 11:
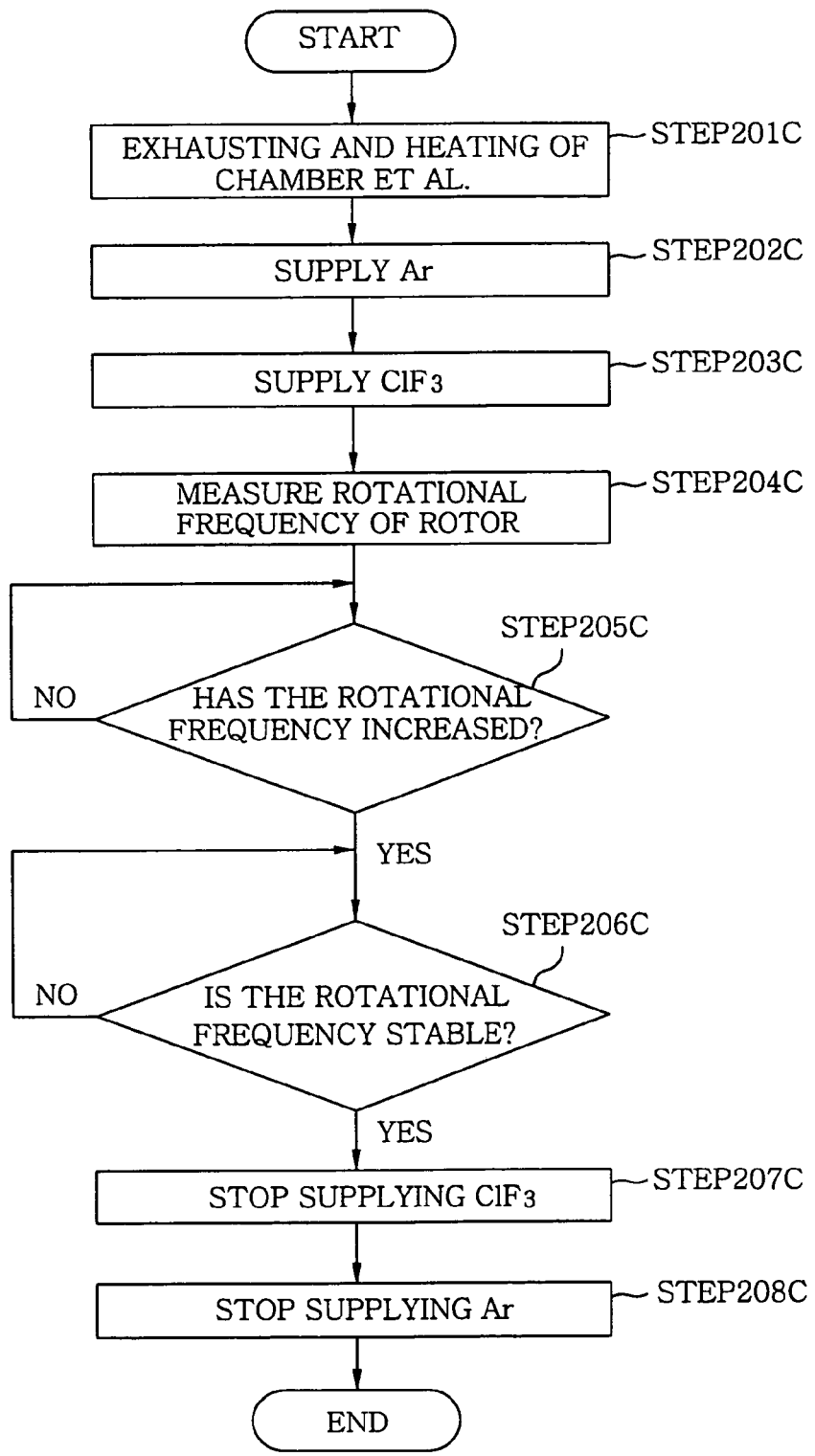
FIG. 11 provides a flowchart describing a cleaning process performed by a film forming apparatus in accordance with the third preferred embodiment.
Figure 12:
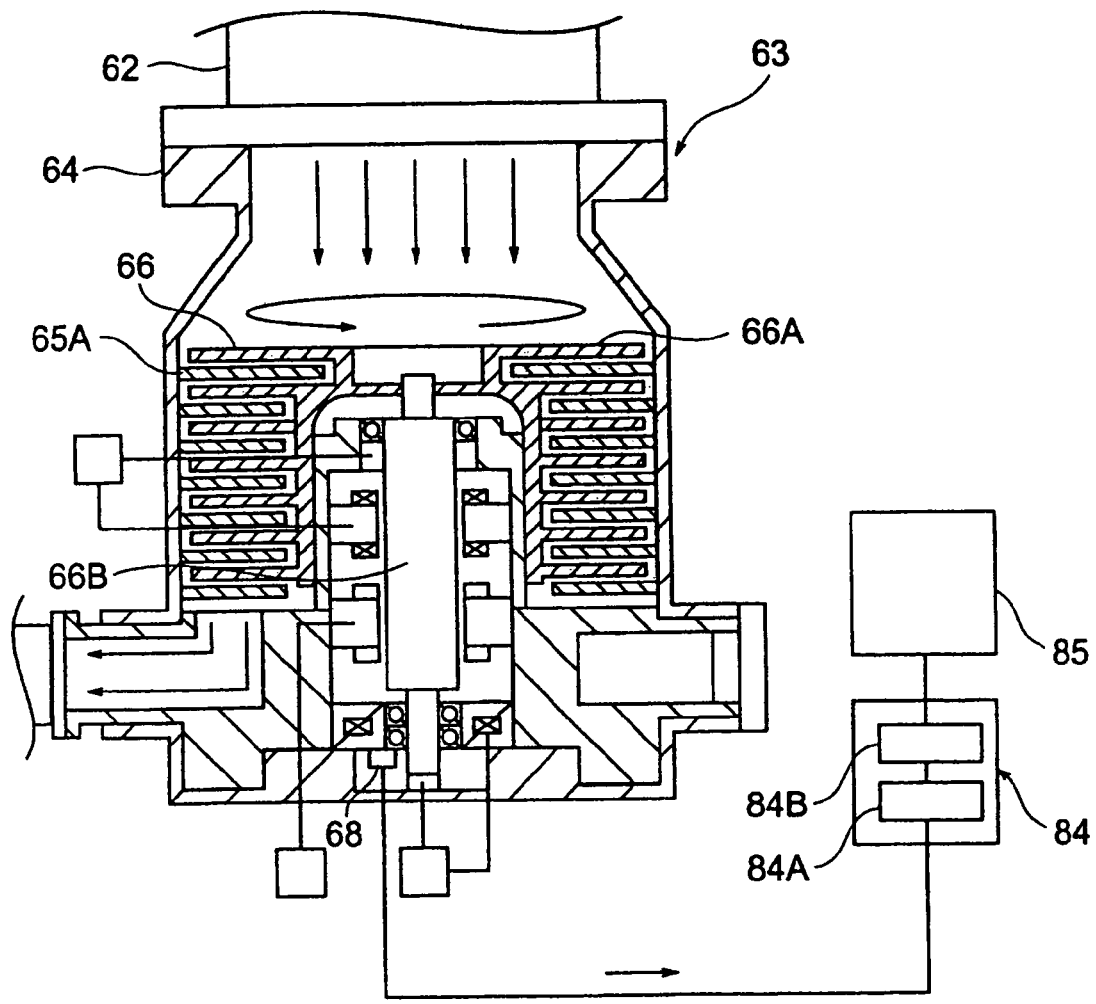
FIG. 12 presents a schematic cleaning process in accordance with the third preferred embodiment.
Figure 13:
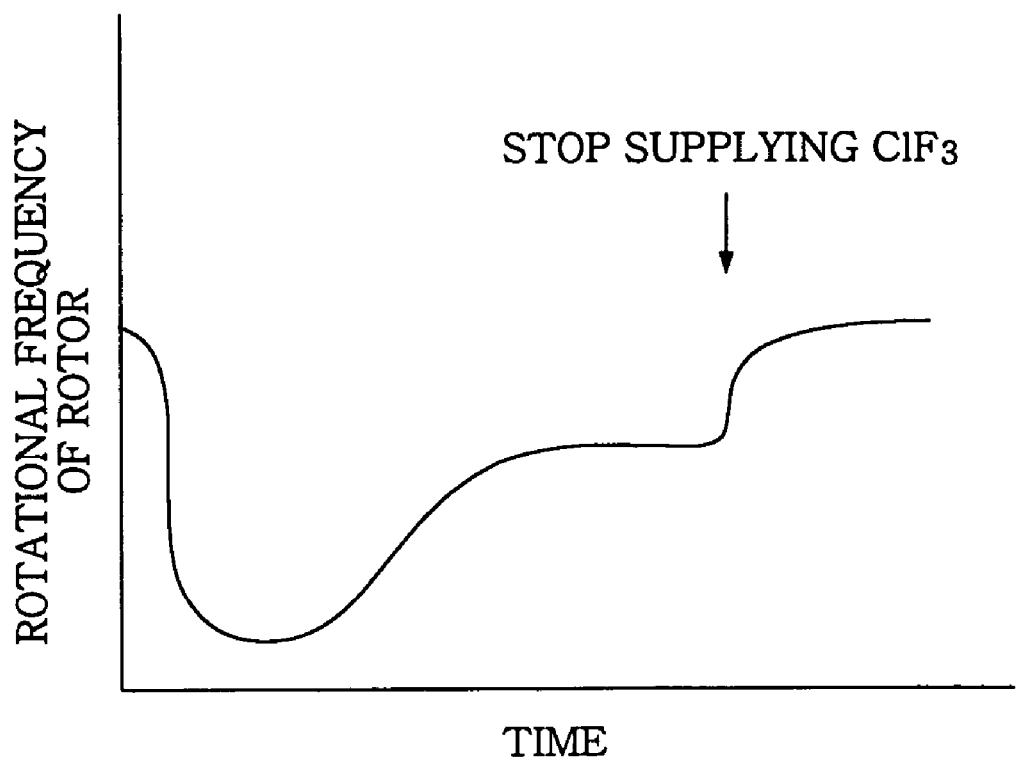
FIG. 13 is a graph schematically showing a rotational frequency of a rotor in accordance with the third preferred embodiment.

Hereinafter, a cleaning process performed in the film forming apparatus 1 will be described with reference to FIGS. 11 to 13. FIG. 11 provides a flowchart describing the cleaning process performed in the film forming apparatus 1 in accordance with this preferred embodiment. FIG. 12 presents a schematic cleaning process in accordance with this preferred embodiment. FIG. 13 is a graph schematically showing a rotational frequency of the rotor 66 in accordance with this preferred embodiment.

First of all, a rough pumping process is performed on the interior of the chamber 2, and then, a main pumping process is performed thereon. Further, the chamber 2, the susceptor 5 and the like are heated (step 201C).

After the inner pressure of the chamber 2 is maintained under 150 Pa and a temperature of the chamber 2 and that of the susceptor 5 are respectively stabilized at about 120° C. and 200° C., Ar is supplied at a flow rate of about 100 sccm into the chamber 2 (step 202C).

Next, $ClF_3$ is supplied at a flow rate of about 200 sccm into the chamber 2 (step 203C).

Thereafter, in a state in which the cleaning is being performed, the rotational frequency of the rotor 66 is measured by the rotational frequency sensor 68, as illustrated in FIG. 12 (step 204C).

The information on the rotational frequency of the rotor 66, which is measured by the rotational frequency sensor 68, is sent to the A/D conversion interface 84A. The information on the rotational frequency, which is sent to the A/D conversion interface 84A, is read by the CPU 84B to thereby determine whether or not the rotational frequency has increased (step 205C). In case it is determined that the rotational frequency has not increased, next rotational frequency information is read and it is determined again whether or not the rotational frequency has increased.

In case it is determined that the rotational frequency has increased, it is determined whether or not the rotational frequency is stable (step 206C). If the rotational frequency is determined to be unstable, next rotational frequency information is read and it is determined again whether or not the rotational frequency is stable.

As described in FIG. 13, if the rotational frequency is determined to be stable, a signal is outputted from the CPU 84B to the system controller 85 and the supply of $ClF_3$ is stopped (step 207C). As a final step, the supply of Ar is stopped (step 208C).

In this preferred embodiment, the rotational frequency of the rotor 66 is measured, and then, an end point of the cleaning is detected based on a change in the rotational frequency. Therefore, the end point of the cleaning can be detected without the generation of plasma. In detail, the rotational frequency of the rotor 66 changes depending on a type and an amount of a gas discharged from the chamber 2. Specifically, as a molecular weight of a gas colliding with the rotor blade 66A becomes smaller, the rotational frequency increases; and as the amount of the gas colliding with the rotor blade 66A becomes smaller, the rotational frequency increases. This is because a load applied to the rotor blade 66A is reduced. Meanwhile, the production of a gas such as $TiF_4$ or the like decreases as the cleaning progresses. Therefore, as the cleaning progresses, the rotational frequency of the rotor 66 increases. Further, by the time the gas is rarely produced to be discharged, the rotational frequency of the rotor 66 becomes stable. Accordingly, the end point of the cleaning can be detected based on the change in the rotational frequency of the rotor 66. As a result, without the generation of plasma, it is possible to detect the end point of the cleaning.

Fourth Preferred Embodiment

Figure 14:
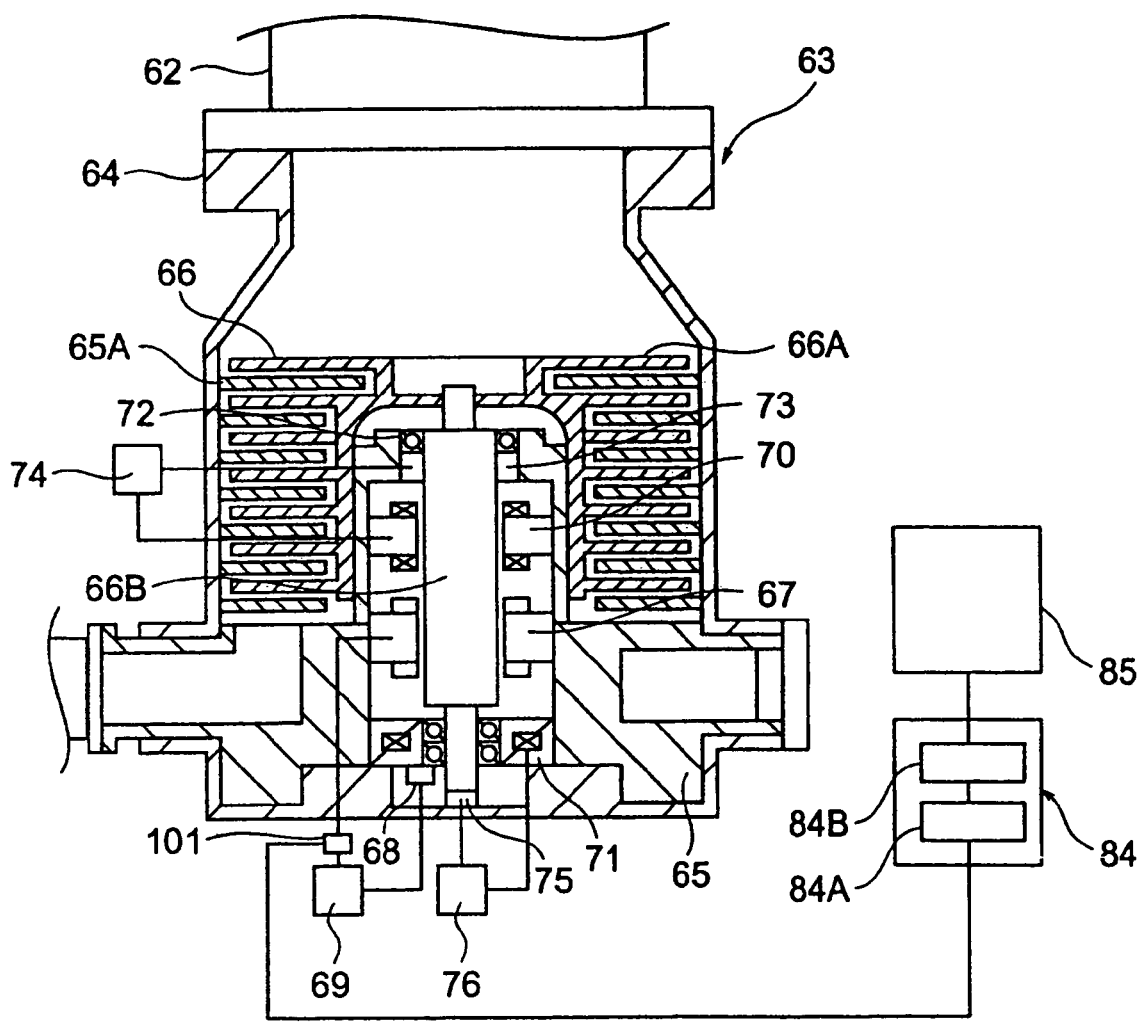
FIG. 14 depicts a schematic diagram of a turbo molecular pump in accordance with a fourth preferred embodiment and peripheral portions thereof.

Hereinafter, the fourth preferred embodiment of the present invention will be described. In this preferred embodiment, an example in which an end point of a cleaning is detected by measuring a current supplied to a motor will be described. FIG. 14 depicts a schematic diagram of a turbo molecular pump in accordance with this preferred embodiment and peripheral portions thereof.

As depicted in FIG. 14, provided between the motor 67 and the motor controller 69 is an ampere meter 101 electrically connected to the motor 67 and the motor controller 69, for measuring a current supplied to the motor 67. Further, the ampere meter 101 is electrically connected to the end point detector 84 also.

Figure 15:
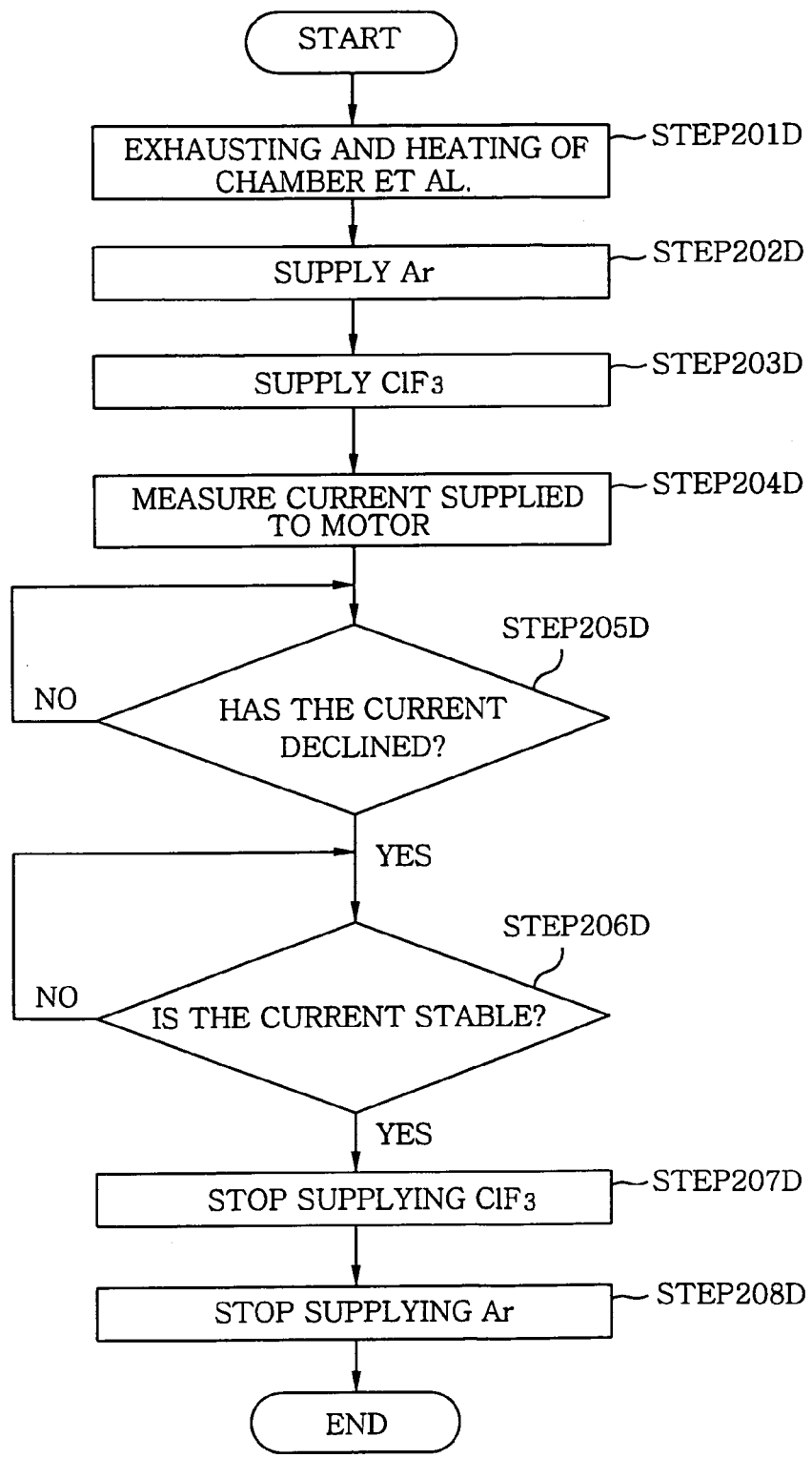
FIG. 15 represents a flowchart describing a cleaning process performed by a film forming apparatus in accordance with the fourth preferred embodiment.
Figure 16:
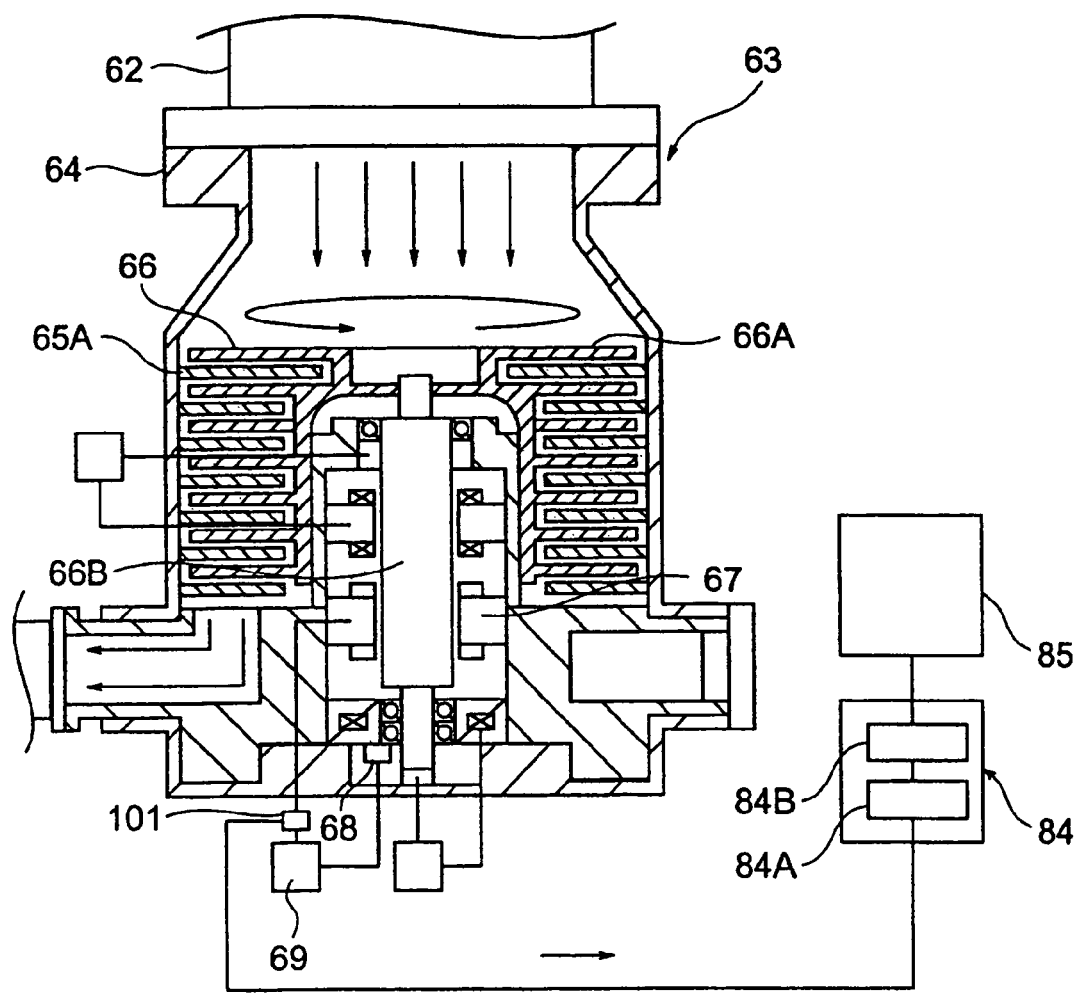
FIG. 16 illustrates a schematic cleaning process in accordance with the fourth preferred embodiment.
Figure 17:
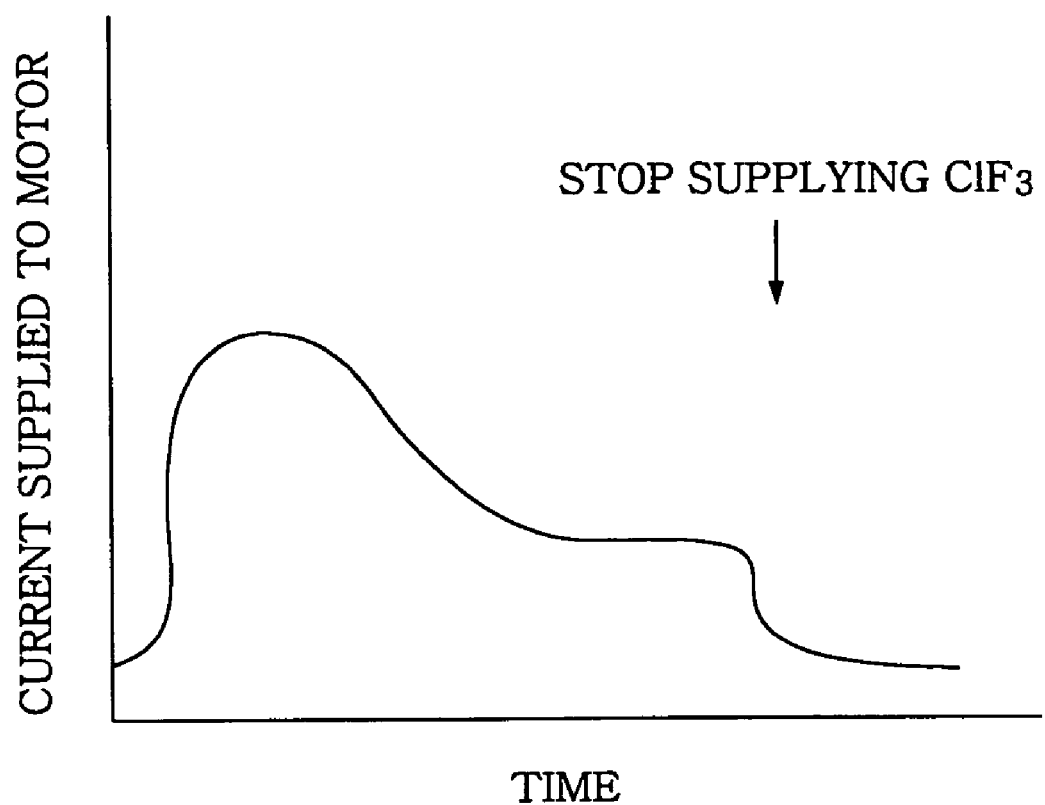
FIG. 17 depicts a graph schematically describing a current supplied to a motor in accordance with the fourth preferred embodiment.

Hereinafter, a cleaning process performed in the film forming apparatus 1 will be described with reference to FIGS. 15 to 17. FIG. 15 represents a flowchart describing the cleaning process performed in the film forming apparatus 1 in accordance with this preferred embodiment. FIG. 16 illustrates a schematic cleaning process in accordance with this preferred embodiment. FIG. 17 depicts a graph schematically describing a current supplied to the motor 67 in accordance with the fourth preferred embodiment.

First of all, a rough pumping process is performed on the interior of the chamber 2, and then, a main pumping process is performed thereon. Further, the chamber 2, the susceptor 5 and the like are heated (step 201D).

After the inner pressure of the chamber 2 is maintained under 150 Pa and a temperature of the chamber 2 and that of the susceptor 5 are respectively stabilized at about 120° C. and 200° C., Ar is supplied at a flow rate of about 100 sccm into the chamber 2 (step 202D).

Next, $ClF_3$ is supplied at a flow rate of about 200 sccm into the chamber 2 (step 203D).

Thereafter, in a state in which the cleaning is being performed, the current supplied to the motor 67 is measured by the ampere meter 101, as illustrated in FIG. 16 (step 204D).

Information on the current measured by the ampere meter 101 is sent to the A/D conversion interface 84A. The current information sent to the A/D conversion interface 84A is read by the CPU 84B to thereby determine whether or not the current has declined (step 205D). In case it is determined that the current has not declined, next current information is read and it is determined again whether or not the current has declined.

As described in FIG. 17, in case it is determined that the current has declined, it is determined whether or not the current is stable (step 206D). If the current is determined to be unstable, next current information is read and it is determined again whether or not the current is stable.

If the current is determined to be stable, a signal is outputted from the CPU 84B to the system controller 85 and the supply of $ClF_3$ is stopped (step 207D). As a final step, the supply of Ar is stopped (step 208D).

In this preferred embodiment, the current supplied to the motor 67 is measured, and then, an end point of the cleaning is detected based on a change in the current. Therefore, the end point of the cleaning can be detected without the generation of a plasma. In detail, the current supplied to the motor 67 changes depending on a type and an amount of a gas discharged from the chamber 2. Specifically, as a molecular weight of a gas colliding with the rotor blade 66A becomes smaller, the current declines; and as the amount of the gas colliding with the rotor blade 66A becomes smaller, the current declines. This is because a load applied to the rotor blade 66A is reduced. Meanwhile, the production of a gas such as $TiF_4$ or the like decreases as the cleaning progresses. Therefore, as the cleaning progresses, the current supplied to the motor 67 declines. Further, by the time the gas is rarely produced to be discharged, the current supplied to the motor 67 becomes stable. Accordingly, the end point of the cleaning can be detected based on the change in the current supplied to the motor 67. As a result, without the generation of a plasma, it is possible to detect the end point of the cleaning.

Fifth Preferred Embodiment

Figure 18:
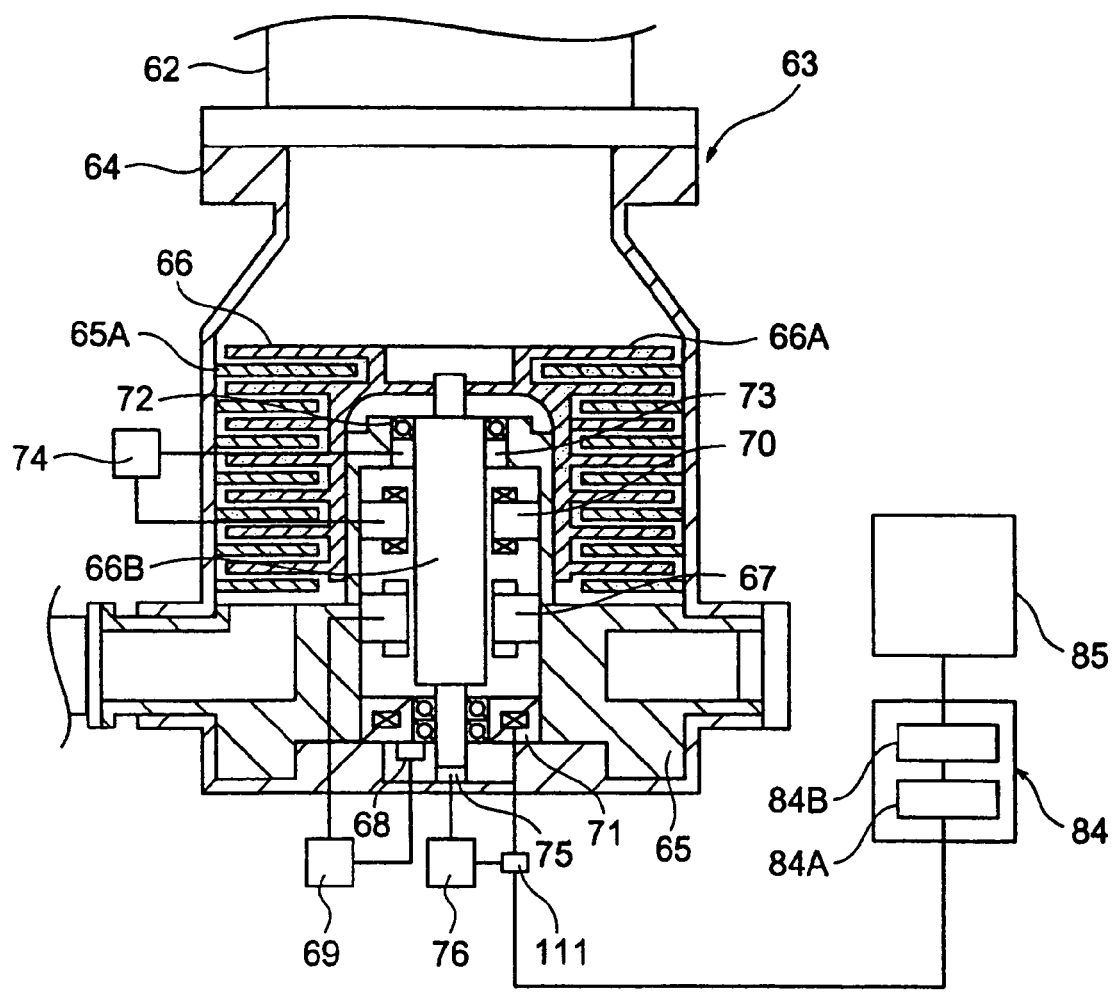
FIG. 18 presents a schematic diagram of a turbo molecular pump in accordance with a fifth preferred embodiment and peripheral portions thereof.

Hereinafter, the fifth preferred embodiment of the present invention will be described. In this preferred embodiment, an example in which an end point of a cleaning is detected by measuring a current supplied to a thrust magnetic bearing will be described. FIG. 18 presents a schematic diagram of a turbo molecular pump in accordance with this preferred embodiment and peripheral portions thereof.

As depicted in FIG. 18, provided between the thrust magnetic bearing 71 and the thrust magnetic bearing controller 76 is the ampere meter 111 electrically connected to the thrust magnetic bearing 71 and the thrust magnetic bearing controller 76, for measuring a current supplied to the thrust magnetic bearing 71. Further, the ampere meter 111 is electrically connected to the end point detector 84.

Figure 19:
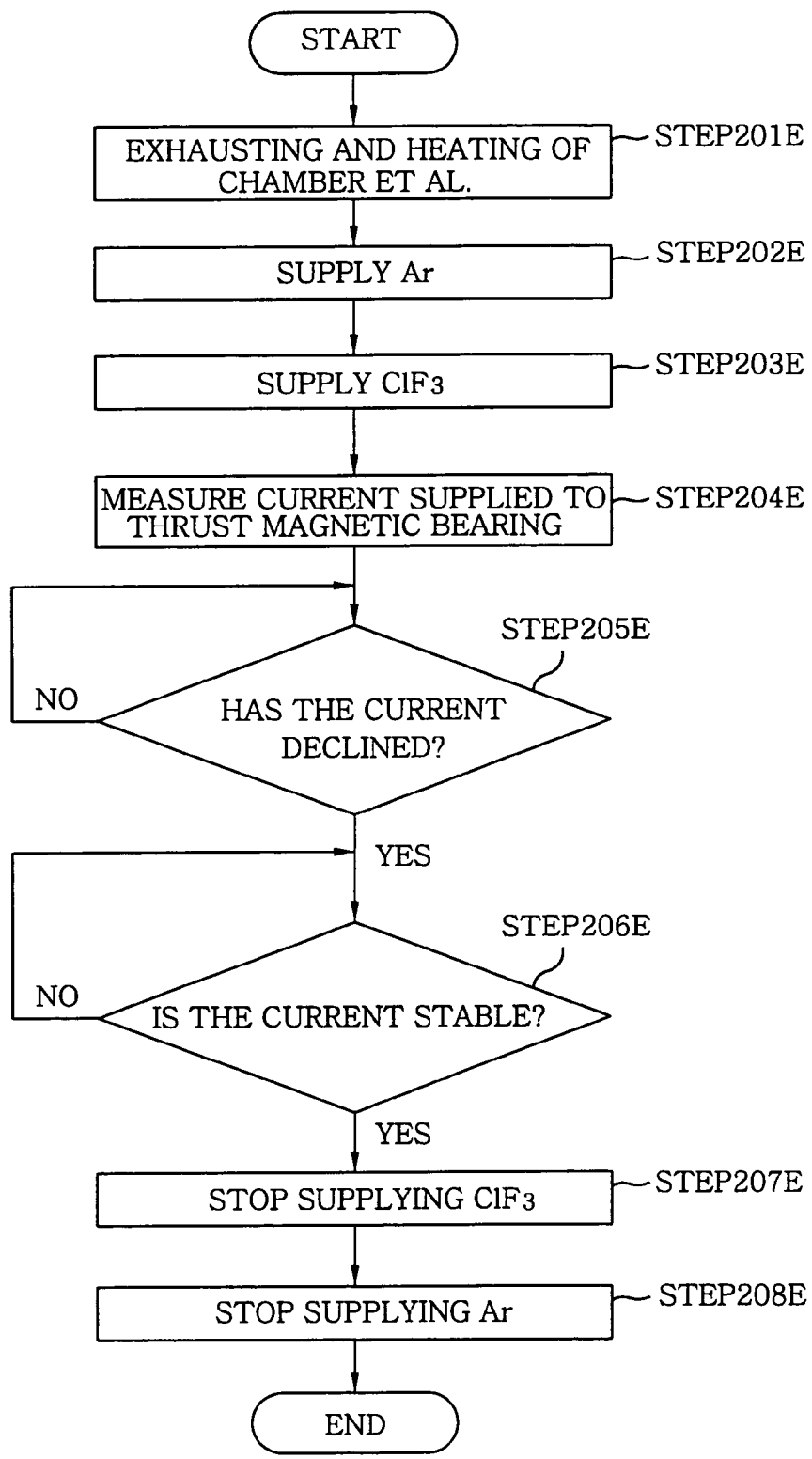
FIG. 19 sets forth a flowchart describing a cleaning process performed by a film forming apparatus in accordance with the fifth preferred embodiment.
Figure 20:
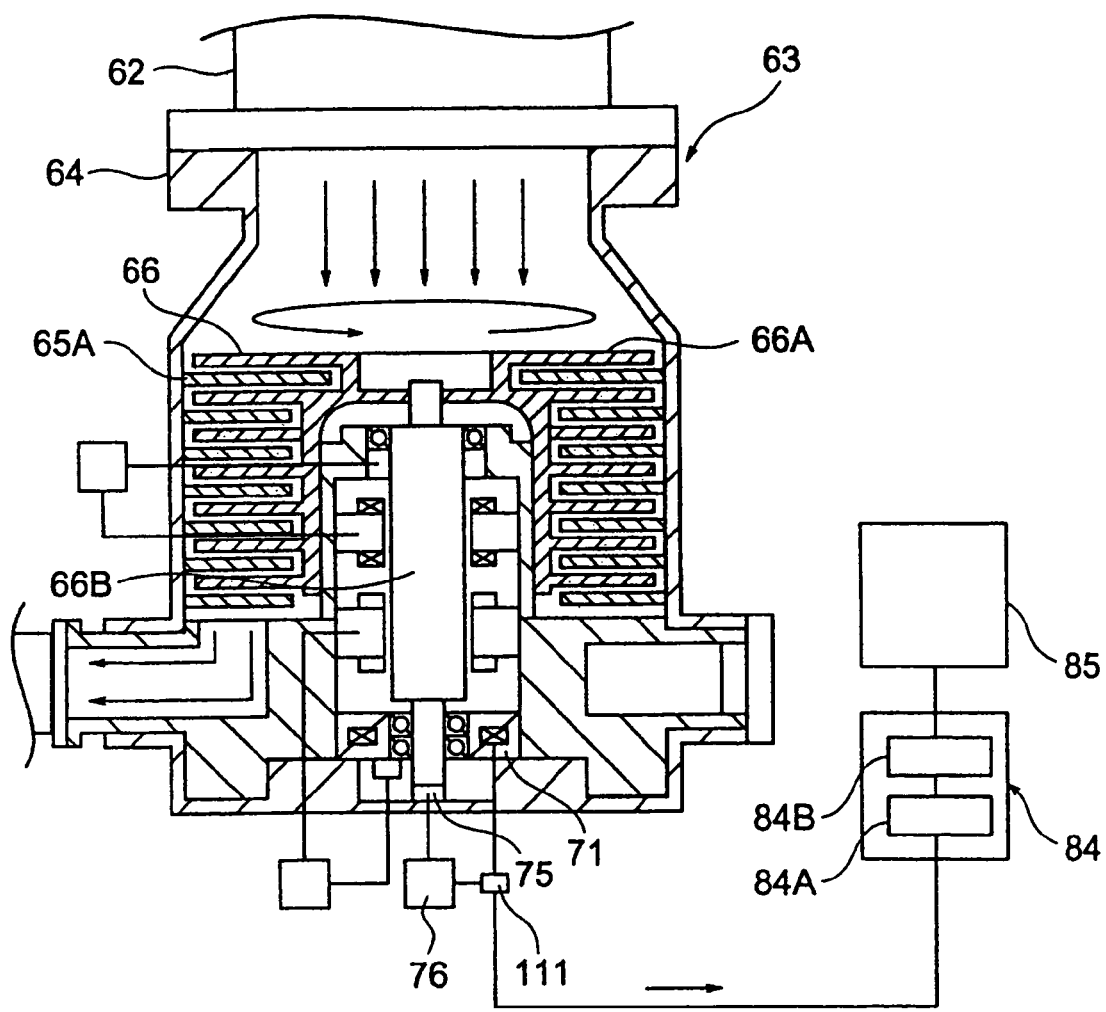
FIG. 20 shows a schematic cleaning process in accordance with the fifth preferred embodiment.
Figure 21:
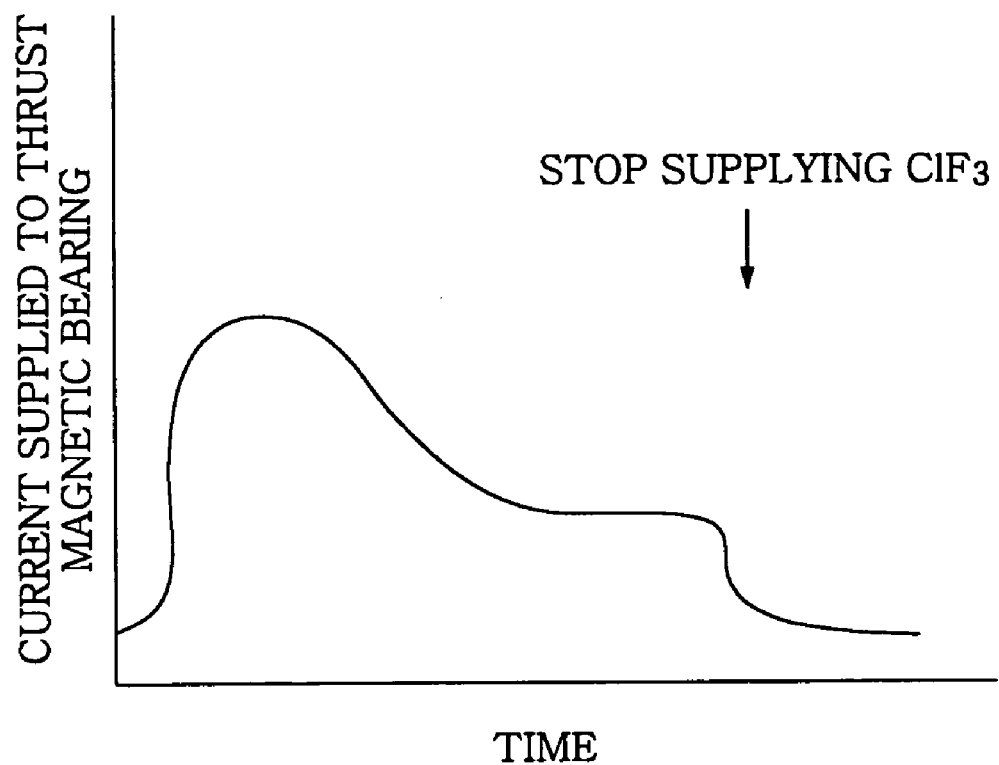
FIG. 21 offers a graph schematically illustrating a current supplied to a thrust magnetic bearing in accordance with the fifth preferred embodiment.

Hereinafter, the cleaning process performed in the film forming apparatus 1 will be described with reference to FIGS. 19 to 21. FIG. 19 sets forth a flowchart describing the cleaning process performed in the film forming apparatus 1 in accordance with this preferred embodiment. FIG. 20 shows a schematic cleaning process in accordance with this preferred embodiment. FIG. 21 offers a graph schematically illustrating the current supplied to the thrust magnetic bearing 71 in accordance with this preferred embodiment.

First of all, a rough pumping process is performed on the interior of the chamber 2, and then, a main pumping process is performed thereon. Further, the chamber 2, the susceptor 5 and the like are heated (step 201E).

After the inner pressure of the chamber 2 is maintained under 150 Pa and a temperature of the chamber 2 and that of the susceptor 5 are respectively stabilized at about 120° C. and 200° C., Ar is supplied at a flow rate of about 100 sccm into the chamber 2 (step 202E).

Next, $ClF_3$ is supplied at a flow rate of about 200 sccm into the chamber 2 (step 203E).

Thereafter, in a state in which the cleaning is being performed, the current supplied to the thrust magnetic bearing 71 is measured by the ampere meter 111, as illustrated in FIG. 20 (step 204E).

Information on the current measured by the ampere meter 111 is sent to the A/D conversion interface 84A. The current information sent to the A/D conversion interface 84A is read by the CPU 84B to thereby determine whether or not the current has declined (step 205E). In case it is determined that the current has not declined, next current information is read and it is determined again whether or not the current has declined.

In case it is determined that the current has declined, it is determined whether or not the current is stable (step 206E). If the current is determined to be unstable, next current information is read and it is determined again whether or not the current is stable.

As illustrated in FIG. 21, if the current is determined to be stable, a signal is outputted from the CPU 84B to the system controller 85 and the supply of $ClF_3$ is stopped (step 207E). As a final step, the supply of Ar is stopped (step 208E).

In this preferred embodiment, the current supplied to the thrust magnetic bearing 71 is measured, and then, an end point of the cleaning is detected based on a change in the current. Therefore, the end point of the cleaning can be detected without the generation of a plasma. In detail, the current supplied to the thrust magnetic bearing 71 changes depending on a type and an amount of a gas discharged from the chamber 2. Specifically, as a molecular weight of a gas colliding with the rotor blade 66A becomes smaller, the current declines; and as the amount of the gas colliding with the rotor blade 66A becomes smaller, the current declines. This is because a load applied to the rotor blade 66A is reduced. Meanwhile, the production of a gas such as $TiF_4$ or the like decreases as the cleaning progresses. Therefore, as the cleaning progresses, the current supplied to the thrust magnetic bearing 71 declines. Further, by the time the gas is rarely produced to be discharged, the current supplied to the thrust magnetic bearing 71 becomes stable. Accordingly, the end point of the cleaning can be detected based on the change in the current supplied to the thrust magnetic bearing 71. As a result, without the generation of a plasma, it is possible to detect the end point of the cleaning.

Further, the present invention is not limited to the description of the aforementioned embodiments. Various changes and modifications can be made in a structure, a material, an arrangement of each member or the like without departing from the spirit and scope of the invention. Although the end point of the cleaning is detected by the end point detector 84 in accordance with the first to the fifth embodiments, it is possible to detect an end point of a treatment on a wafer W such as an etching or the like. In this case, instead of a cleaning gas, a process gas, e.g., an etching gas or the like, for processing the wafer W is supplied into the chamber 2. And, other details are almost same as those in the method of detecting an end point of a cleaning, which have been described in the first to the fifth embodiments.

Although $ClF_3$ is excited by heat in accordance with the first to the fifth embodiments, it is possible to excite $ClF_3$ by a plasma, light or the like. Further, although $TiCl_4$ and $NH_3$ are supplied alternatively, they may be supplied simultaneously also. Furthermore, although a wafer W is used, a glass substrate can also be used instead.

In the fifth embodiment, the current supplied to the thrust magnetic bearing 71 is measured. However, it is possible to measure a current supplied to the radial magnetic bearing 70.

While the invention has been shown and described with respect to the preferred embodiments, it will be understood by those skilled in the art that various changes and modifications may be made without departing from the spirit and scope of the invention as defined in the following claims.

INDUSTRIAL APPLICABILITY

The substrate processing unit, method of detecting an end point of a cleaning of the substrate processing unit, and method of detecting an end point of a substrate processing in accordance with the present invention can be used in a semiconductor manufacturing industry.

What is claimed is:

1. A substrate processing unit comprising:
a processing vessel that accommodates a substrate;
a cleaning gas supply system that supplies a cleaning gas into the processing vessel to be used in performing a cleaning of an interior of the processing vessel;
an exhauster that includes rotor blades that exhaust the interior of the processing vessel by rotation of the rotor blades;
an operating state detector that detects effects of collisions between a gas and the rotor blades so as to determine a change in an amount of or a molecular weight of the gas that passes through the exhauster; and
an end point detector that detects an end point of the cleaning based on a detection result from the operating state detector.

2. The substrate processing unit of claim 1, wherein the operating state detector includes a vibration detector that detects the change in the amount of or the molecular weight of the gas that collides with the rotor blades by detecting a vibration of the exhauster.

3. The substrate processing unit of claim 2, wherein the vibration detector includes a sound wave detector that detects a sound wave produced by the vibration of the exhauster.

4. The substrate processing unit of claim 2, wherein the end point detector detects the end point based on a change in the intensity of the vibration.

5. The substrate processing unit of claim 1, wherein the exhauster includes a rotatable body of revolution for exhaust, and the operating state detector includes a rotation detector that detects the change in the amount of or the molecular weight of the gas that collides with the rotor blades by detecting a rotation of the body of revolution.

6. The substrate processing unit of claim 1, wherein the exhauster includes a rotatable body of revolution for exhaust and a driving mechanism for rotating the body of revolution by a current supply, and wherein the operating state detector includes a current detector that detects a current supplied to the driving mechanism.

7. The substrate processing unit of claim 1, wherein the exhauster includes a rotatable body of revolution for exhaust and a magnetic bearing for supporting the body of revolution by a current supply, and wherein the operating state detector includes a current detector that detects a current supplied to the magnetic bearing.

8. A substrate processing unit comprising:
a processing vessel that accommodates a substrate;
a process gas supply system that supplies a process gas into the processing vessel to be used in performing a processing on the substrate;
an exhauster that includes rotor blades that exhaust an interior of the processing vessel by rotation of the rotor blades;
an operating state detector that detects effects of collisions between a gas and the rotor blades so as to determine a change in an amount of or a molecular weight of the gas that passes through the exhauster; and
an end point detector that detects an end point of the processing based on a detection result from the operating state detector.

9. The substrate processing unit of claim 8, wherein the operating state detector includes a vibration detector that detects the change in the amount of or the molecular weight of the gas that collides with the rotor blades by detecting a vibration of the exhauster.

10. The substrate processing unit of claim 9, wherein the vibration detector includes a sound wave detector that detects a sound wave produced by the vibration of the exhauster.

11. The substrate processing unit of claim 9, wherein the end point detector detects the end point based on a change in the intensity of the vibration.

12. The substrate processing unit of claim 8, wherein the exhauster includes a rotatable body of revolution for exhaust, and the operating state detector includes a rotation detector that detects the change in the amount of or the molecular weight of the gas that collides with the rotor blades by detecting a rotation of the body of revolution.

13. The substrate processing unit of claim 8, wherein the exhauster includes a rotatable body of revolution for exhaust and a driving mechanism for rotating the body of revolution by a current supply, and wherein the operating state detector includes a current detector that detects a current supplied to the driving mechanism.

14. The substrate processing unit of claim 8, wherein the exhauster includes a rotatable body of revolution for exhaust and a magnetic bearing for supporting the body of revolution by a current supply, and wherein the operating state detector includes a current detector that detects a current supplied to the magnetic bearing.

15. The substrate processing unit of claim 1, wherein the end point detector detects the end point of the cleaning by determining whether the amount of or the molecular weight of a gas colliding with the rotor blades stabilizes with the progress of the cleaning following a period of initially instability.

16. The substrate processing unit of claim 15, wherein the operating state detector includes a vibration detector that detects a vibration of the exhauster.

17. The substrate processing unit of claim 16, wherein the vibration detector includes a sound wave detector that detects a sound wave produced by the vibration of the exhauster.

18. A substrate processing unit comprising:
a processing vessel that accommodates a substrate;
a cleaning gas supply system that supplies a cleaning gas into the processing vessel to be used in performing a cleaning of an interior of the processing vessel;
an exhauster that includes rotor blades that exhaust the interior of the processing vessel by rotation of the rotor blades;
operating state detector means for detecting effects of collisions between a gas and the rotor blades so as to determine a change in an amount of or a molecular weight of the gas that passes through the exhauster; and
means for detecting an end point of the cleaning based on a detection result from the operating state detector means.

19. A substrate processing unit comprising:
a processing vessel that accommodates a substrate;
a process gas supply system that supplies a process gas into the processing vessel to be used in performing a processing on the substrate;
an exhauster that includes rotor blades that exhaust the interior of the processing vessel by rotation of the rotor blades;
operating state detector means for detecting effects of collisions between a gas and the rotor blades so as to determine a change in an amount of or a molecular weight of the gas that passes through the exhauster; and
means for detecting an end point of the processing based on a detection result from the operating state detector means.

* * * * *